United States Patent
Furuya et al.

(10) Patent No.: US 8,018,646 B2
(45) Date of Patent: Sep. 13, 2011

(54) WAVELENGTH CONVERSION ELEMENT, LASER LIGHT SOURCE, TWO-DIMENSIONAL IMAGE DISPLAY AND LASER PROCESSING SYSTEM

(75) Inventors: Hiroyuki Furuya, Nara (JP); Akihiro Morikawa, Osaka (JP); Kiminori Mizuuchi, Osaka (JP); Kazuhisa Yamamoto, Osaka (JP); Shinichi Kadowaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 687 days.

(21) Appl. No.: 11/997,099

(22) PCT Filed: Jul. 26, 2006

(86) PCT No.: PCT/JP2006/314777
§ 371 (c)(1), (2), (4) Date: Jan. 28, 2008

(87) PCT Pub. No.: WO2007/013513
PCT Pub. Date: Feb. 1, 2007

(65) Prior Publication Data
US 2010/0165452 A1    Jul. 1, 2010

(30) Foreign Application Priority Data

Jul. 28, 2005  (JP) ................... 2005-218257
Sep. 27, 2005  (JP) ................... 2005-279698

(51) Int. Cl.
*G02F 1/35* (2006.01)
(52) U.S. Cl. ....................................... 359/326
(58) Field of Classification Search ........... 359/326–332
See application file for complete search history.

(56) References Cited

U.S. PATENT DOCUMENTS

| | | | |
|---|---|---|---|
| 5,247,528 A | 9/1993 | Shinozaki et al. | |
| 5,359,452 A | 10/1994 | Nitanda et al. | |
| 5,412,502 A | 5/1995 | Makio et al. | |
| 5,568,308 A | 10/1996 | Harada | |

(Continued)

FOREIGN PATENT DOCUMENTS

JP    3-33096    2/1991

(Continued)

OTHER PUBLICATIONS

Chinese Office Action issued Jul. 24, 2009 in corresponding Chinese Patent Application No. 200680027288.5.

(Continued)

*Primary Examiner* — Hemang Sanghavi
(74) *Attorney, Agent, or Firm* — Wenderoth Lind & Ponack, L.L.P.

(57) ABSTRACT

A wavelength conversion element is provided with a substrate including a nonlinear optical single crystal having a periodically poled structure, wherein a visible light transmittance of the substrate is 85% or higher when ultraviolet light is irradiated to the substrate. Further, a laser light having an average output of 1 W or more is outputted by shortening a wavelength of inputted laser light having a wavelength of 640 nm to 2000 nm. By improving visible light transmission characteristics when the ultraviolet light is irradiated in this way, a breakdown of crystal can be prevented and a stabilization of output characteristics at high output can be realized. As a result, an absorption of green light induced by ultraviolet light can also be suppressed and a saturation of output and the breakdown of crystal can be avoided.

24 Claims, 30 Drawing Sheets

U.S. PATENT DOCUMENTS

| | | |
|---|---|---|
| 6,519,077 B1 | 2/2003 | Mizuuchi et al. |
| 6,747,787 B2 * | 6/2004 | Furukawa et al. ............ 359/326 |
| 7,236,674 B2 * | 6/2007 | Mizuuchi et al. ............. 385/130 |
| 2004/0095970 A1 | 5/2004 | Yamamoto et al. |
| 2006/0257084 A1 | 11/2006 | Mizuuchi et al. |
| 2007/0121685 A1 * | 5/2007 | Maekawa ........................ 372/21 |
| 2007/0153850 A1 * | 7/2007 | Scripsick et al. ............... 372/39 |

FOREIGN PATENT DOCUMENTS

| | | |
|---|---|---|
| JP | 5-97591 | 4/1993 |
| JP | 6-16500 | 1/1994 |
| JP | 6-130436 | 5/1994 |
| JP | 6-242478 | 9/1994 |
| JP | 6-283791 | 10/1994 |
| JP | 11-271823 | 10/1999 |
| JP | 2001-194694 | 7/2001 |
| JP | 2002-72266 | 3/2002 |
| JP | 2003-267798 | 9/2003 |
| JP | 2003-267799 | 9/2003 |
| JP | 2004-219845 | 8/2004 |
| WO | WO 2004063809 A1 * | 7/2004 |

OTHER PUBLICATIONS

International Search Report issued Aug. 29, 2006 in the International (PCT) Application No. PCT/JP2006/314777.

Akihiro Morikawa et al., "1W Green Generation by Bulk-Type Periodically Poled Z Cut MgO:LiNbO.", Extended Abstracts (the $51^{st}$ Spring Meeting, 2004); The Japan Society of Applied Physics and Related Societies, No. 3, Mar. 28, 2004, p. 1220.

D. A. Bryan et al., "Increased Optical Damage Resistance in Lithium Niobate", Applied Physics letters, 44(9), pp. 847-849 (1984).

D. H. Jundt et al., "Periodically Poled $LiNbO_3$ for High Efficiency Second -Harmonic Generation", Applied Physics letters, 59(21), pp. 2657-2659 (1991).

* cited by examiner

WAVELENGTH CONVERSION ELEMENT, LASER LIGHT SOURCE, TWO-DIMENSIONAL IMAGE DISPLAY AND LASER PROCESSING SYSTEM

TECHNOLOGICAL FIELD

The present invention relates to a wavelength conversion element using a nonlinear optical crystal for wavelength conversion, and a laser light source, a two-dimensional image display device and a laser processing system using such an element.

BACKGROUND ART

High-output laser light sources are attracting attentions as light sources used in laser processing systems or laser displays. In an infrared region, solid-state lasers such as YAG lasers, fiber lasers using fibers doped with rare earths such as Yb and Nd and the like are being developed. In red and blue regions, semiconductor lasers using GaAs, gallium nitride, etc. are being developed and higher outputs are also being studied.

On the other hand, in a green region, it remains still difficult to directly generate green light from a semiconductor and it is a general practice to generate green light by wavelength-converting infrared light generated from the aforementioned solid-state laser or fiber laser by means of nonlinear optical crystal. Before the development of gallium nitride, there exists virtually no method for obtaining lights from a visible region to an ultraviolet region other than wavelength conversion using a nonlinear optical crystal. Various nonlinear optical materials such as lithium niobate ($LiNbO_3$), lithium tantalate ($LiTaO_3$), lithium triborate ($LiB_3O_5$: LBO), β-barium borate (β-$BaB_2O_4$), potassium titanyl phosphate ($KTiOPO_4$: KTP), cesium lithium borate ($CsLiB_6O_{10}$: CLBO) have been developed.

Particularly, in the case of using lithium niobate crystal as nonlinear optical crystal, it is known that high conversion efficiency can be obtained by a large nonlinear optical constant. Since the construction of a device can be simplified, a quasi phase matched (QPM) wavelength conversion element formed using this crystal and poling technology is frequently used in devices having outputs of about 200 to 300 mW. Further, in a device capable of obtaining several W (Watts) output, nonlinear optical crystals such as LBO and KTP are used.

The above LBO crystal has a feature that breakdown and deteriorations due to fundamental wave and generated second harmonic are less likely to occur, whereas it is necessary to construct a resonator and arrange the crystal in the resonator in order to obtain high conversion efficiency, which necessitates a complicated device construction and precise adjustments since it has a small nonlinear optical constant. On the other hand, the KTP crystal has a larger nonlinear optical crystal than the LBO crystal and can obtain high conversion efficiency even without constructing a resonator, whereas it has a disadvantage that breakdown and deteriorations due to fundamental wave and generated second harmonic are likely to occur.

An example has been reported in which, by the crystal growth of lithium niobate and lithium tantalate by a method for doping additive in crystals as in patent literature 1 or approximating the crystal composition to an ideal composition (stoichiometric composition) as in patent literature 2, a refractive index change by light, i.e. optical damage as one of crystal deteriorations can be suppressed.

As described above, nonlinear optical crystals have advantages and disadvantages, and it is being studied to reduce the power density of fundamental wave per wavelength conversion element in order to suppress deteriorations by determining crystal to be used based on tradeoff between the advantages and disadvantages or by using a plurality of wavelength conversion elements as in patent literature 3. The construction of a wavelength converter disclosed in patent literature 3 is shown in FIG. 30.

As shown in FIG. 30, fundamental wave emitted from a fundamental wave light source 101 has second harmonic (green light) 105a split by a separation mirror 103a after being wavelength-converted by a wavelength converting portion 102a, the fundamental wave having passed through the separation mirror 103a has second harmonic (green light) 105b split by a separation mirror 103b after being wavelength-converted by a wavelength converting portion 102b and the remaining fundamental wave becomes residual fundamental wave 106. In this case, there were problems of having a complicated structure and doubling the number of parts since the number of wavelength conversion elements is increased.

The above-mentioned patent literature 1 and 2 disclose methods for doping magnesium oxide to avoid a phenomenon called optical damage. Patent literatures 4 to 7 and nonpatent literature 1 also describe methods for doping magnesium oxide to avoid a phenomenon called optical damage. For example, in the case of lithium niobate, it is generally well-known that this optical damage can be avoided if 5 mol or more of magnesium oxide is added. Besides, an example of realizing the generation of green light of 1.7 W by heating lithium niobate crystal doped with 5 mol of magnesium oxide to 140° C. is reported in nonpatent literature 2.

Specifically, the above-described optical damage is referring to a light induced refractive index changing phenomenon (photorefractive) in which electrons are excited by an optical electric field and refractive indices around a position, where a laser beam passed, change due to the electro-optic effect of a crystal. More specifically, the optical damage is caused only by green light (second harmonic) having a low output in the order of several hundreds mW if infrared light to become fundamental wave is converted into the green light (second harmonic) and is also caused even if magnesium oxide is not doped.

In order to suppress the photorefractive as one of the above crystal deteriorations, proposals have been made to control such that the absorption end of transmittance is located at a shorter wavelength by adding magnesium oxide or zinc oxide and/or to improve the transmittance of a general visible region (not transmittance when light having a specific wavelength is irradiated) in order to compensate for holes formed even after impurities forming an absorption peak in a crystal are maximally removed and electric charges generated by antisite defects where an element constituting a crystal is located on a site different from the original one.

However, crystal breakdown and deteriorations cannot be completely suppressed at present even if magnesium oxide is doped within the above range. Particularly, in the case of obtaining harmonic having a high output in the order of several W, crystal breakdown and deteriorations could not be suppressed.

Patent Literature 1: Japanese Patent No. 3261594
Patent Literature 2: Japanese Patent No. 3424125
Patent Literature 3:
Japanese Unexamined Patent Publication NO. H11-271823
Patent Literature 4: Japanese Patent No. 2720525

Patent Literature 5:
  Japanese Unexamined Patent Publication NO. H06-242478
Patent Literature 6:
  Japanese Unexamined Patent Publication NO. 2003-267799
Patent Literature 7:
  Japanese Unexamined Patent Publication NO. 2003-267798
Nonpatent Literature 1:
  Applied Physics letters, 44, 9, 847-849 (1984)
Nonpatent Literature 2:
  Applied physics letters, 59, 21, 2657-2659 (1991)

DISCLOSURE OF THE INVENTION

An object of the present invention is to provide a wavelength conversion element, a laser light source, a two-dimensional image display device and a laser processing system capable of preventing the breakdown of crystal and realizing the stabilization of output characteristics at high output by improving visible light transmittance characteristics when ultraviolet light is irradiated.

One aspect of the present invention is directed to a wavelength conversion element, comprising a substrate including a nonlinear optical single crystal having a periodically poled structure, wherein the substrate is made of lithium niobate or lithium tantalate; the visible light transmittance of the substrate is 85% or higher when ultraviolet light is irradiated to the substrate; and laser light having an average output of 1 W or more is outputted by shortening the wavelength of laser light having a wavelength of 640 nm to 2000 nm.

Another aspect of the present invention is directed to a laser light source, comprising the above wavelength conversion element, wherein the wavelength conversion element outputs continuous light having an average output of 2 W or more and a wavelength of 400 nm to 660 nm or pulsed light having an average output of 1 W or more and a wavelength of 400 nm to 660 nm.

Still another aspect of the present invention is directed to a two-dimensional image display, comprising the above laser light source, wherein an image is displayed using laser light emitted from the laser light source.

Further another aspect of the present invention is directed to a laser processing system, comprising the above laser light source, wherein an object is processed using laser light emitted from the laser light source.

In the above wavelength conversion element, laser light source, two-dimensional image display and laser processing system, the breakdown of the nonlinear optical single crystal can be prevented and the stabilization of output characteristics at high output power can be realized by improving visible light transmission characteristics when ultraviolet light is irradiated.

BEST MODES FOR EMBODYING THE INVENTION

Figure 1:
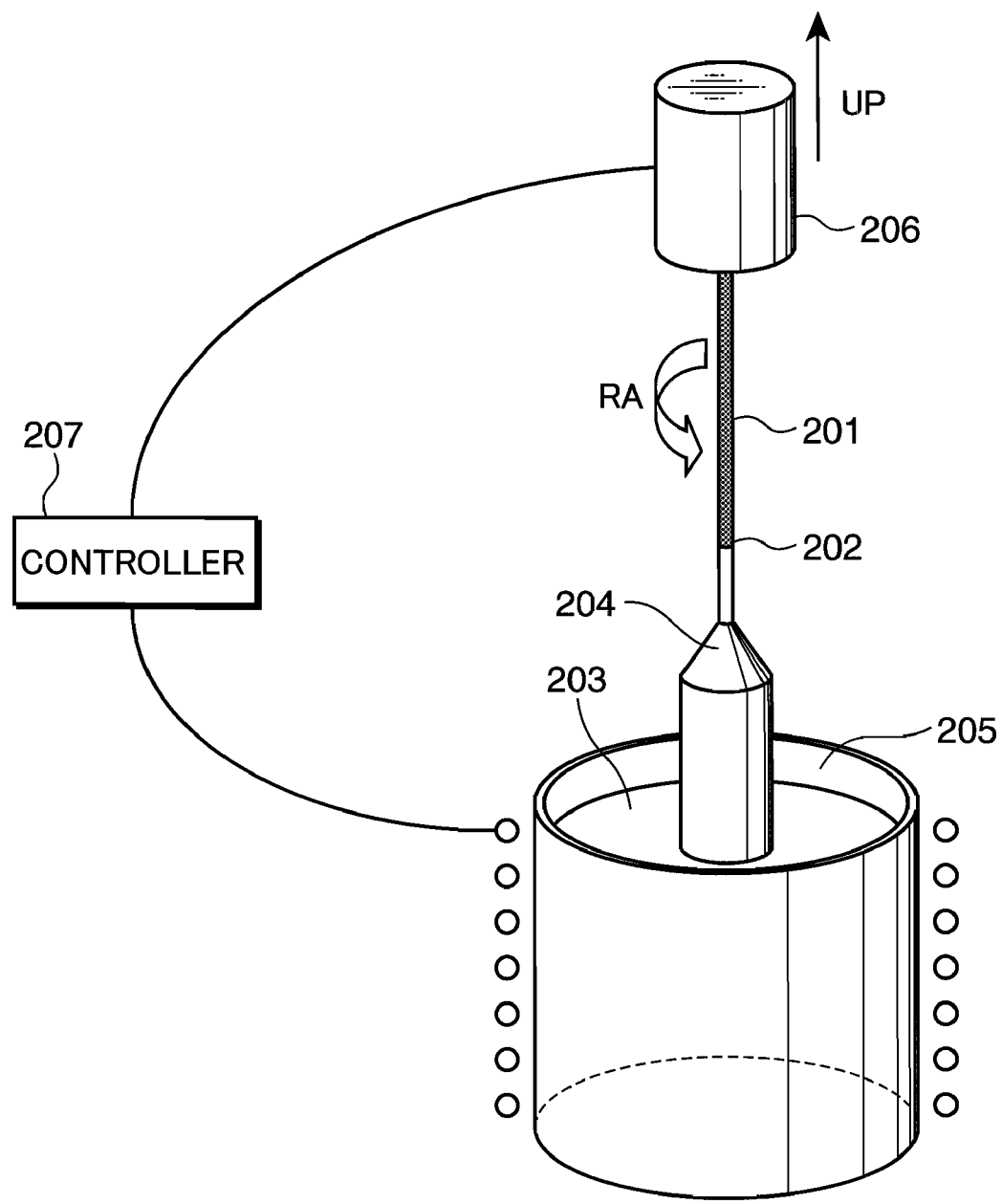
FIG. 1 is a diagram showing a single crystal growing apparatus for growing a single crystal used for a wavelength conversion element according to a first embodiment of the invention.

In order to solve the above problems residing in the prior art, the present inventors keenly studied the breakdown and deteriorations of crystal that occur when harmonics of several W are generated and, as a result, identified the causes of the breakdown and deteriorations of crystal by a principle different from that of the above optical damage. This new cause of the breakdown and deteriorations of crystal is described in detail below.

Since a quasi phase matched element (QPM-LN element) using lithium niobate crystal (LN) or lithium tantalate (LT) has a large nonlinear optical constant than the aforementioned LBO crystal and KTP crystal, wavelength conversion having high efficiency and high output is possible. However, since the QPM-LN element needs to condense light energy in a narrow region, the breakdown and deteriorations of crystal caused by fundamental wave and generated second harmonic are substantially more likely to occur than with the KTP crystal.

Because of the above large nonlinear optical constant, in the case of obtaining harmonic of several W, ultraviolet light (third harmonic) that is sum frequency of infrared light as fundamental wave and converted green light (second harmonic) is generated even if a phase matching condition is not met. It was found out that this generated ultraviolet light induced the absorption of the green light as an example of visible light to induce the saturation of green high output and the breakdown of crystal.

In this specification, the breakdown of crystal by this ultraviolet light (third harmonic) is called the breakdown of crystal by ultraviolet induced green light absorption (UVIGA) in order to be distinguished from the above optical damage. The breakdown of crystal by the ultraviolet induced green light absorption does not occur when only the green light (second harmonic) is present, but occur when the fundamental wave and the second harmonic are combined. Further, this breakdown does not occur if lithium niobate crystal (LN) or lithium tantalate (LT) is not doped, but occurs when magnesium is added.

Although it differs depending on elements, in the case of generating green light, the breakdown of crystal by the ultraviolet induced green light absorption starts when an output of 1 W or more is generated. Further, in the case of generating blue light having a short wavelength, a threshold value of the breakdown of crystal decreases and the breakdown of crystal by the ultraviolet induced green light absorption is known to start if an average output of continuous light is 2 W or more. Further, in the case of pulsed oscillation having a high peak value, the breakdown of crystal by the ultraviolet induced green light absorption starts when the average output becomes 1 W or more.

Further, it was proven by an experiment that the breakdown of crystal by the ultraviolet induced green light absorption could not be suppressed even if a LN crystal and a LT crystal doped with impurity as disclosed in patent literature 1 or LN (SLN) and LT (SLT) having a stoichiometric composition disclosed in patent literature 2 were used. A generation method using a plurality of crystals as in patent literature 3 is possible, but there were problems of cumbersome adjustments, increased production cost and the like.

Based on the above knowledge, the present inventors earnestly studied a wavelength conversion element for preventing the breakdown of crystal by the ultraviolet induced green light absorption and completed the present invention. Specifically, the wavelength conversion element of the present invention includes a substrate composed of a nonlinear optical single crystal having a periodically poled structure, wherein the substrate is made of lithium niobate or lithium tantalate and laser light having an average output of 1 W or more is outputted by shortening the wavelength of laser light whose visible light transmittance in the waveguide direction of the substrate is 85% or higher and whose wavelength is 640 nm to 2000 nm when ultraviolet light is irradiated to this substrate.

In this wavelength conversion element, it can be realized to prevent the breakdown of the nonlinear optical single crystal and to stabilize output characteristics at high output by improving visible light transmission characteristics when ultraviolet light is irradiated. By these effects, the absorption of second harmonic (green light) induced by third harmonic that is ultraviolet light can also be suppressed and it becomes possible to avoid the saturation of outputs and the breakdown of crystal. In addition, it has been a conventional practice to distribute a fundamental wave output and use a plurality of wavelength conversion elements in order to obtain a high output. However, by using this wavelength conversion element, the device can be simplified, complicated adjustments can be avoided and production cost can be reduced.

Specifically, by adding about 5.10 mol % to 5.70 mol % of magnesium to a lithium niobate single crystal having congruent composition ([Li/(LI+Nb)] ratio is 0.046 to 0.482:congruent melt composition) in concentration or by adding about 5.0 mol % to 8.0 mol % of magnesium to a lithium tantalate single crystal having a congruent composition (Li/Ta ratio is 94.2±2%) in concentration, the unnecessary absorption of the second harmonic by the third harmonic is suppressed and the saturation of a green high output and the breakdown of crystal are avoided. Further, also at the time of pulsed oscillation, the breakdown of crystal and optical components can be avoided by regulating a current waveform to be inputted to an excitation laser.

The wavelength of the above ultraviolet light is preferably 320 nm to 380 nm, and that of the visible light is preferably 400 nm to 660 nm. In this case, it is possible to prevent the breakdown of crystal by the ultraviolet induced green light absorption and to output green light having a high output.

The temperature of the above substrate at the time of wavelength conversion is preferably 20° C. to 60° C. In this case, a heating device such as a heater becomes unnecessary, whereby a low-cost light source can be realized.

Hereinafter, embodiments of the present invention are described with reference to the accompanying drawings.

First Embodiment

A wavelength conversion element according to a first embodiment of the present invention converts infrared light into green light using a lithium niobate crystal having a congruent composition and doped with magnesium oxide (MgO) as a nonlinear optical crystal used for wavelength conversion. This wavelength conversion element is described in detail below.

Lithium niobate used in this embodiment is produced, for example, using the Czochralski method as one of crystal growth methods. A production method of lithium niobate doped with magnesium oxide (MgO) is described below.

First, lithium carbonate ($Li_2CO_3$), niobium oxide ($Nb_2O_5$) and magnesium oxide (MgO) having a purity of 4N were weighed and temporarily sintered at 1100° C. for 10 hours. In this case, a mol ratio of a doped amount of magnesium oxide was determined by $MgO/(LiNbO_3+MgO)$. The Mg concentration of the crystal (Mg content ratio) was set to 5.00 mol %, 5.30 mol %, 5.60 mol %, 5.80 mol %, 6.00 mol % and 6.50 mol %. In this embodiment, the Mg concentration of the crystal means a mol percent in the composition of the crystal in a state after the pulling up to be described later and this is the same in other embodiments.

FIG. 1 is a diagram showing an apparatus for growing a single crystal of lithium niobate used for a wavelength conversion element according to the first embodiment of the invention. The raw material produced as above was poured into a platinum crucible 205 having a diameter of 100 mm and a height of 100 mm and molten by high frequency induction heating. It is set that an operation of melting the raw material while supplying it was repeated and temperature on the surface of the melt became 1260° C. when the crucible 205 was filled with the raw melt, and a seed crystal of lithium niobate was introduced. By a controller 207 constructed by a personal computer or the like, the temperature (high frequency current value) of the crucible 205 was controlled such that an increase per unit time became constant while the weight of the single crystal was measured by a load cell 206 such that the thickness of a single crystal 204 being pulled up became uniform.

In this embodiment, a pull-up direction was set to a Z-axis direction (C-axis among crystal axes) that is a dielectric principal axis of the crystal, and MgO:$LiNbO_3$ crystal having a diameter of 50 mm and a length of about 50 mm was obtained within about two days. The rotating speed of the seed crystal in an axial rotation direction RA at this time was 20 rpm and the pull-up speed was 2 mm/h. The raw material of the crystal was filled in the crucible 205 and the seed crystal 202 fixed to a pull-up rod 201 was brought into contact with the melt 203 and gradually pulled up to grow the single crystal. The grown crystalline body was cut into an upper (shoulder) part and a lower (tail) part, a processing was carried out for mono domain crystal, and the resulting crystal was cut in a direction normal to a Z-axis and outer end surfaces were polished to obtain a MgO:LN wafer (Z plate).

Figure 2:
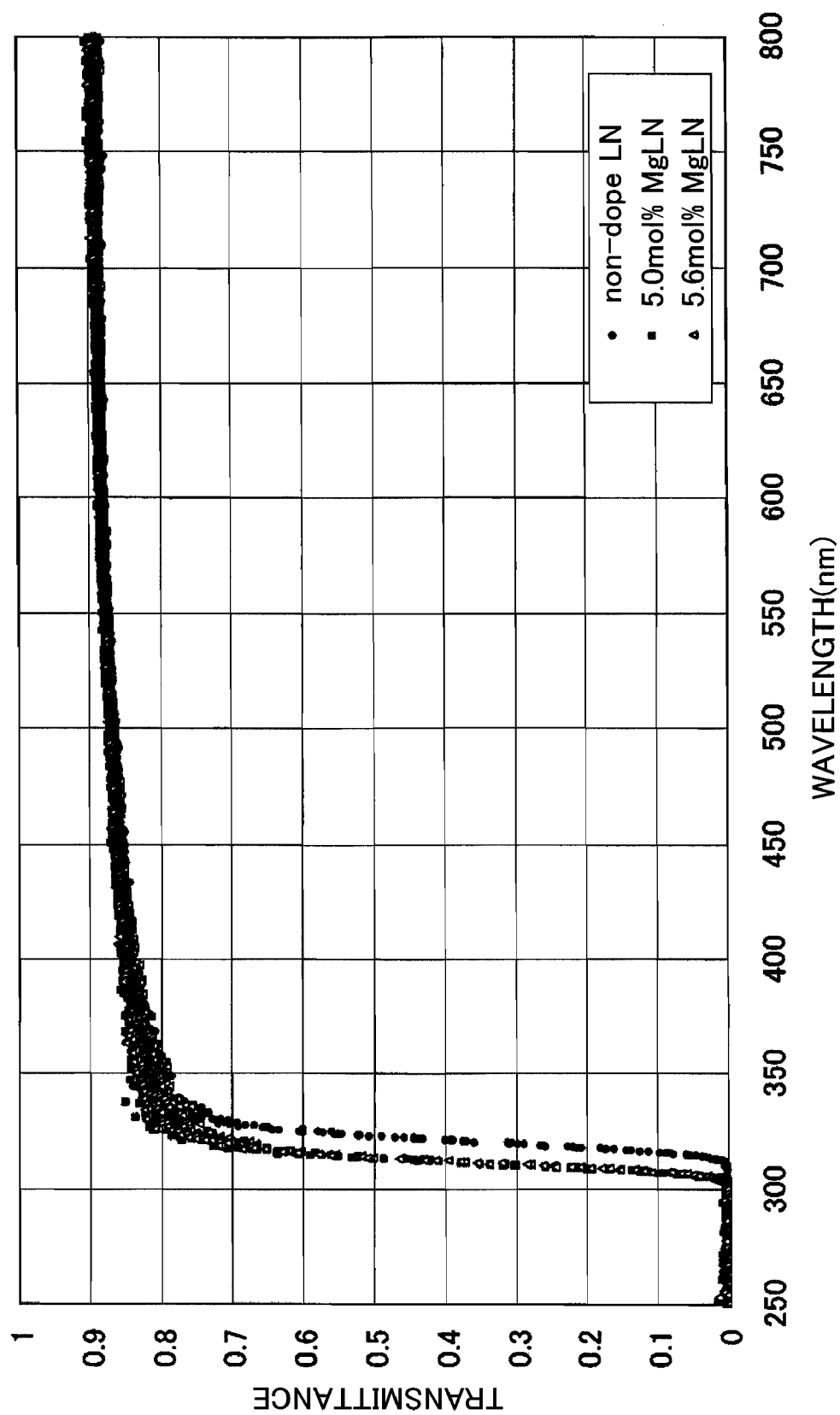
FIG. 2 is a graph showing transmittance spectra of a $LiNbO_3$ crystal doped with Mg used for the wavelength conversion element according to the first embodiment of the invention.

Ordinary transmission spectra of the thus obtained wafer were measured by a spectral photometer. FIG. 2 shows transmission spectra of a $LiNbO_3$ crystal not doped with Mg (non-dope LN) and $LiNbO_3$ crystals having Mg concentrations of 5.0 mol % and 5.6 mol % (5.0 mol % MgLN and 5.6 mol % MgLN). It can be understood from FIG. 2 that ordinary transmission spectra hardly differ at any of Mg concentrations.

Subsequently, the transmittance of green light as an example of visible light at the time of irradiating an ultraviolet light was measured. A measuring method is described with reference to FIG. 3. Measurement samples 403 cut to have a thickness of 1 mm, a longitudinal dimension (beam path) of 25 mm and a width of 5 mm and having the opposite end faces (faces of 1 mm×5 mm) optically polished were fabricated at the respective Mg concentrations. After YAG laser second harmonic (wavelength of 532 nm and output of 30 mW) from a green light source 401 is condensed by a lens 402, the condensed light was incident on the fabricated measurement sample 403. At this time, the absorptance of the green light at the time of irradiating ultraviolet light was measured by monitoring the light output of the second harmonic from the emergent surface of the sample 403 using a photodiode 404 for the cases where an UV lamp 405 (wavelength of 340 to 400 nm) is driven to irradiate and not driven. It should be noted that this testing method is called a mercury lamp irradiation test hereinafter.

Figure 4:
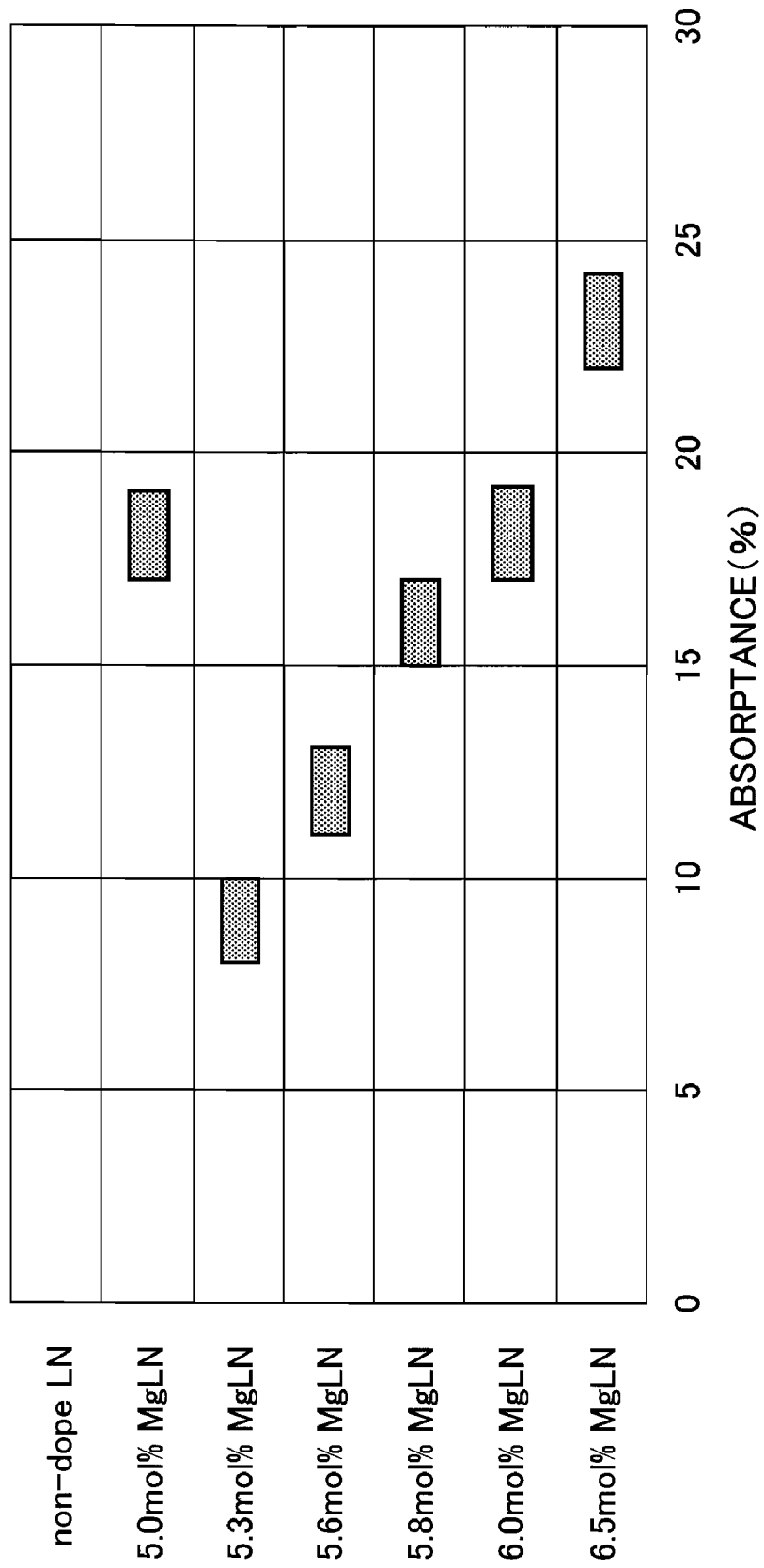
FIG. 4 is a graph showing evaluation results of the ultraviolet light induced green light absorption with the kinds and concentrations of impurity as parameters in the $LiNbO_3$ crystal doped with Mg used for the wavelength conversion element according to the first embodiment of the invention.

Measurement results are summarized in FIG. 4. There is no reduction in the transmittance of the green light in the $LiNbO_3$ crystal not doped with Mg (non-dope LN). However, since optical damage (photorefractive), which has been a conventional problem, occurs in the $LiNbO_3$ crystal not doped with Mg, this crystal is not suitable for the generation of W-class high-output green light. Further, it can be understood that the transmittance of the green light was reduced by more than 15% in the $LiNbO_3$ crystal having a congruent composition, doped with 5.0 mol % of Mg and conventionally frequency used due to no occurrence of optical damage when the ultraviolet light was irradiated as compared to when the ultraviolet light was not irradiated. It can also be understood that the transmittance of the green light was reduced by more than 15% in the $LiNbO_3$ crystals doped with 5.8 mol % of Mg, 6.0 mol % of Mg and 6.5 mol % of Mg (5.8 mol % MgLN, 6.0 mol % MgLN and 6.5 mol % MgLN) when the ultraviolet light was irradiated as compared to when the ultraviolet light was not irradiated.

On the other hand, a reduction (absorption) in the transmission of the green light as an example of the visible light is 15% or less in $LiNbO_3$ crystals doped with 5.3 mol of MgO and 5.6 mol of MgO which are newly proposed at this time to prevent the breakdown of crystal by the above ultraviolet light induced green light absorption, and is suppressed to about 8% to about 12%.

From the above measurement results, it was found out that light absorption at the time of irradiating ultraviolet light caused not only so-called optical damage that could be suppressed if 5 mol or more of MgO was added as conventionally known, but also the breakdown of crystal by the ultraviolet light induced green light absorption as a phenomenon different from the above optical damage, transmittance reductions could not be uniformly avoided only by adding 5 mol or more of MgO, and there existed a Mg concentration range (e.g. 5.1 mol % to 5.7 mol %) capable of avoiding a reduction in the transmittance by the ultraviolet light induced green light absorption. It was found out that, by adding Mg within this concentration range, the absorption of the green light induced by the ultraviolet light could be suppressed and the conventionally known problem of optical damage could also be avoided.

Subsequently, electrodes were formed on the obtained wafers (Mg doped LiNbO$_3$) having different Mg concentrations by a photo process, and a poling process was performed by applying an electric field. First, a metal film as the material for the electrodes is deposited on such a substrate (with a thickness of mm in this embodiment) that the Z-axis direction as the dielectric principal axis of the crystal was normal to the top surface of the substrate (Z plate) and had the opposite surfaces thereof optically polished. Then, photoresist was applied to form an electrode pattern by a contact printing method. Thereafter, metallic electrodes were formed by a dry etching apparatus. By applying a direct-current pulse train (50000 times, pulse width: 0.5 msec.) to these metallic electrodes, a poled structure was formed in the crystal. An inversion period at this time was, for example, set at $\Lambda=7.36$ μm, which is a generation period of second harmonic having a wavelength of 1084 nm, and the element length was set at 25 mm.

Figure 5:
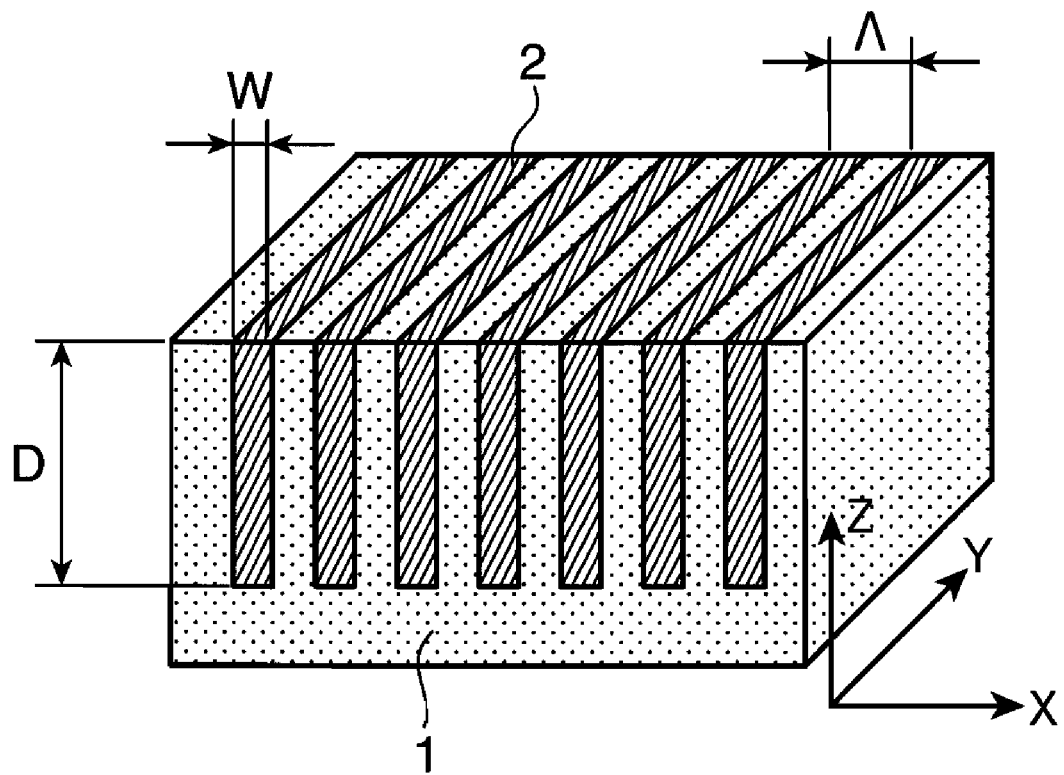
FIG. 5 is a perspective view showing the construction of the wavelength conversion element according to the first embodiment of the invention.

FIG. 5 is a construction diagram of the wavelength conversion element of this embodiment fabricated as described above. In the wavelength conversion element of this embodiment, poling portions 2 are periodically formed on the Mg doped LiNbO$_3$ substrate 1. This wavelength conversion element is an element that satisfies a phase matching condition and converts fundamental wave having a wavelength λ into second harmonic having a wavelength λ/2 by passing light through the periodically formed poling portions 2. The LiNbO$_3$ substrate 1 used in this element is doped with Mg.

The structure of the wavelength conversion element capable of highly efficient conversion is described with respect to the above MgLT. W, D and Λ denote the inversion width, depth and period of the poling portions 2. The poling portions 2 are formed to extend from a +Z surface toward a −Z surface. The stripe direction of the poling portions 2 is a Y-axis direction. The stripe direction of the poling portions 2 and the Y-axis direction preferably define an angle within ±5°. If this angle exceeds 5°, the poling portions 2 become more nonuniform and the conversion efficiency of the wavelength conversion element considerably decreases. Further, the outer surfaces of the wavelength conversion element preferably include a surface substantially normal to the C-axis of the crystal (Z-axis) for the following reasons. Since the poled structure grows along the C-axis, it becomes possible to form a deep poled structure and to sufficiently increase the overlap with the beam of the fundamental wave passing through the wavelength conversion element.

Figure 6:
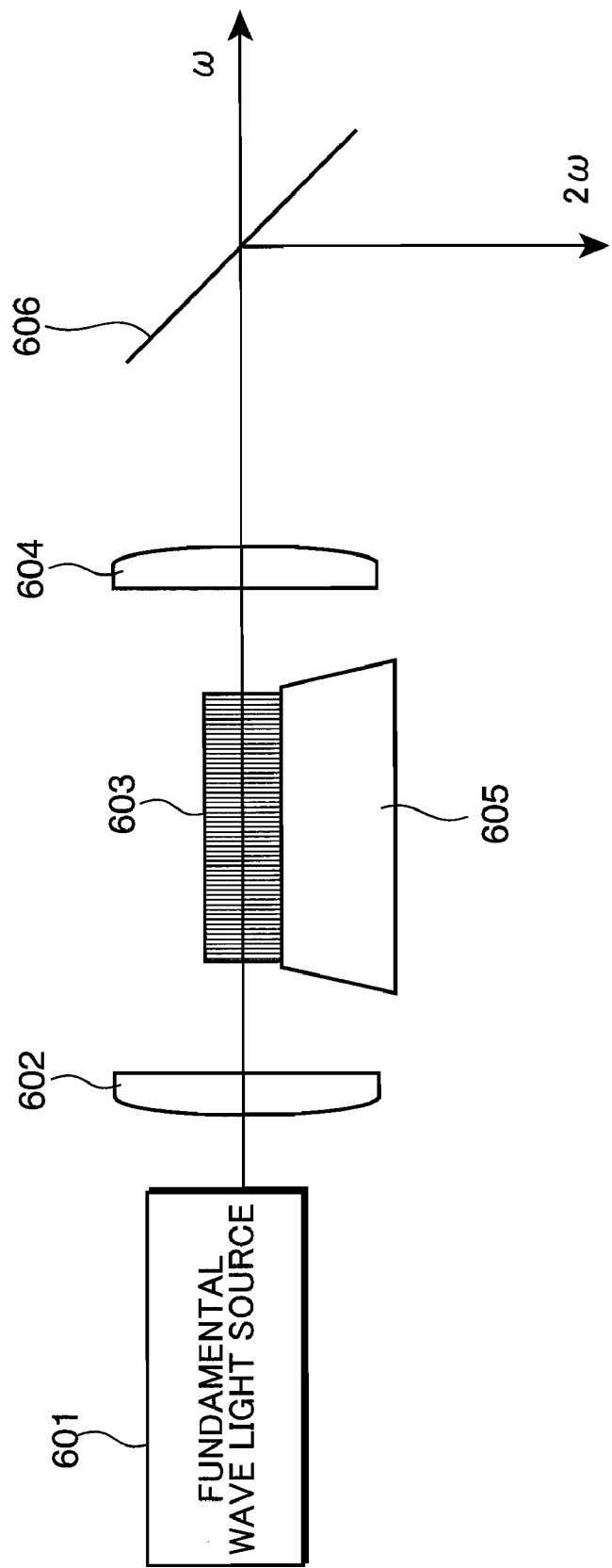
FIG. 6 is a diagram showing a wavelength conversion characteristic evaluating optical system.

Wavelength conversion characteristics were actually evaluated for the case where the thus formed element was used as a wavelength conversion element (polarization inversion element). A wavelength conversion characteristic optical system used for this evaluation is shown in FIG. 6. An Yb-doped fiber laser having an oscillation wavelength of 1084 nm was used as a fundamental wave light source 601. Emitted infrared light (parallel beam: beam diameter of 760 μm) is condensed in a polarization inversion element 603 by a condenser lens 602 (f=30 mm). The polarization inversion element 603 is fixed to a metal plate and is temperature-controlled to about 25° C. by a Peltier element 605. Second harmonic (green light) emitted from this polarization inversion element 603 is split into fundamental wave (ω) and second harmonic (2ω) by a wavelength separating filter 606, and the separated second harmonic is measured by a power meter.

Figure 7:
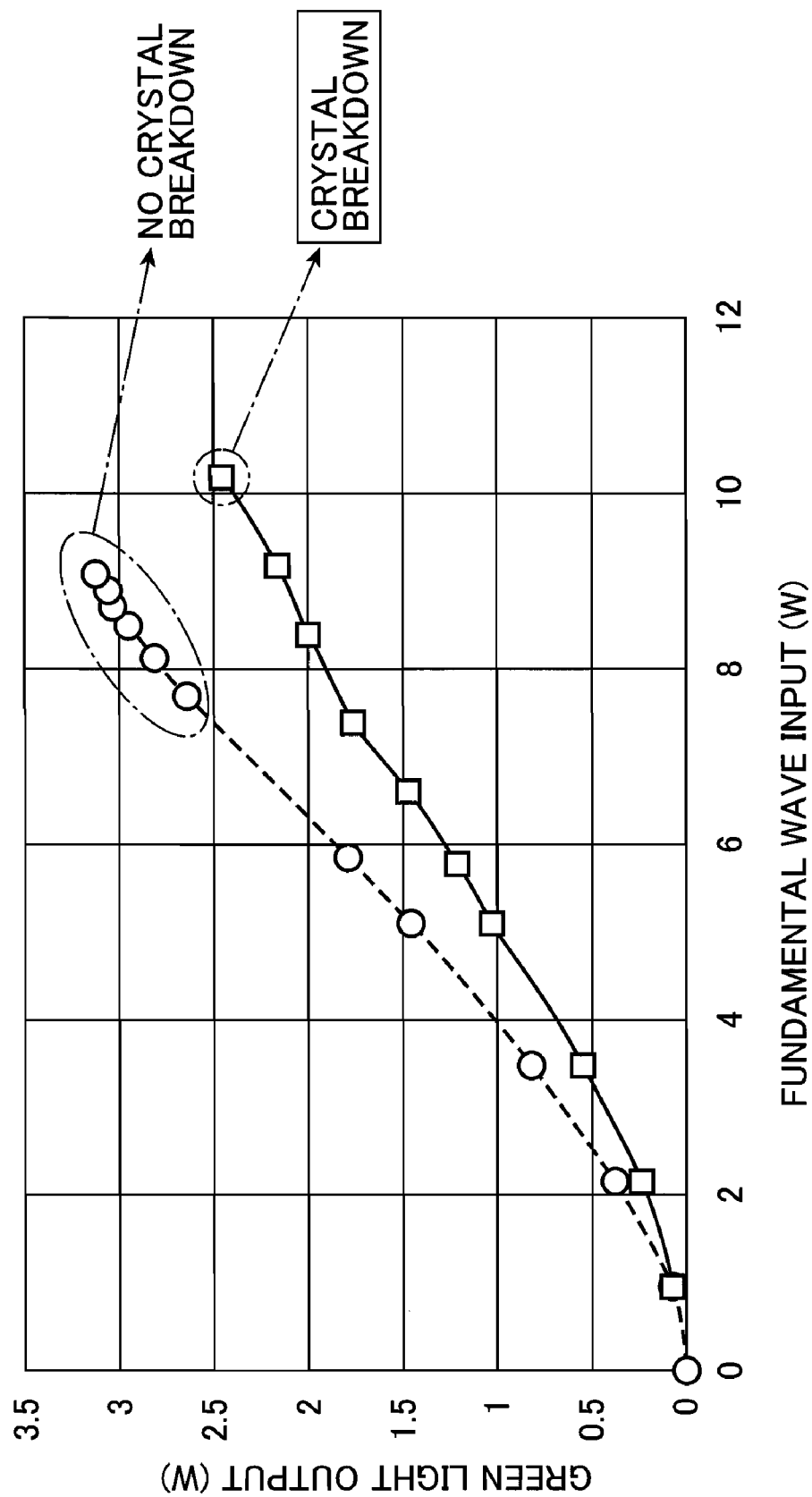
FIG. 7 is a plot graph of evaluation results of wavelength conversion characteristics showing a relationship of a fundamental wave input and a green light output in the case where wavelength conversion elements using $LiNbO_3$ crystals doped with 5.6 Mol % of Mg and 5.0 mol % of Mg were used.

FIG. 7 shows a plot graph showing the characteristic evaluation result of the wavelength conversion element according to this embodiment. Broken line in FIG. 7 represents an output characteristic of the wavelength conversion element according to this embodiment using a LiNbO$_3$ crystal doped with 5.6 mol % of Mg and solid line represents an output characteristic of a conventional wavelength conversion element using a LiNbO$_3$ crystal doped with 5.0 mol % of Mg.

In the wavelength conversion element using the conventional crystal, the saturation of the output started approximately after the input exceeded 8 W by the green light absorption by inadvertently generated ultraviolet light, and internal damage occurred in the crystal at a green high output of 2.4 to 2.8 W. On the other hand, in the wavelength conversion element using the LiNbO$_3$ crystal doped with 5.6 mol % of Mg, the output is slightly saturated approximately after the input exceeds 8 W, but the crystal is not cracked even at a green light output of 3 W or more beyond 2.4 to 2.8 W, i.e. output saturation is suppressed as compared to the doping of 5 mol % of Mg. As a result, an effect by the reduction of the green light absorption caused by ultraviolet light was seen to have appeared.

Figure 8:
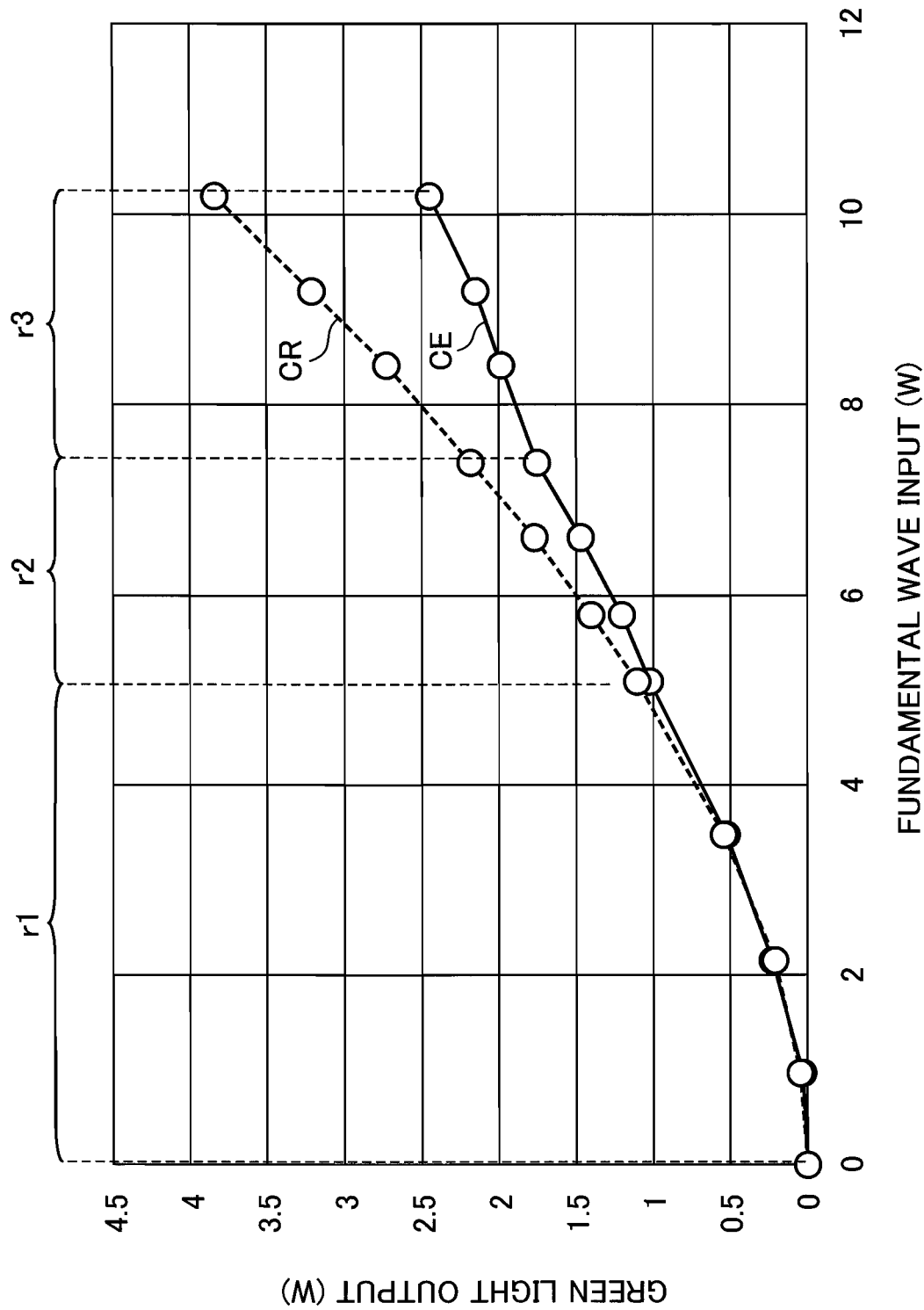
FIG. 8 is a graph showing measurement values and theoretical values of the input/output characteristic of a conventional wavelength conversion element using the $LiNbO_3$ crystal doped with 5.0 mol % of Mg.
Figure 9:
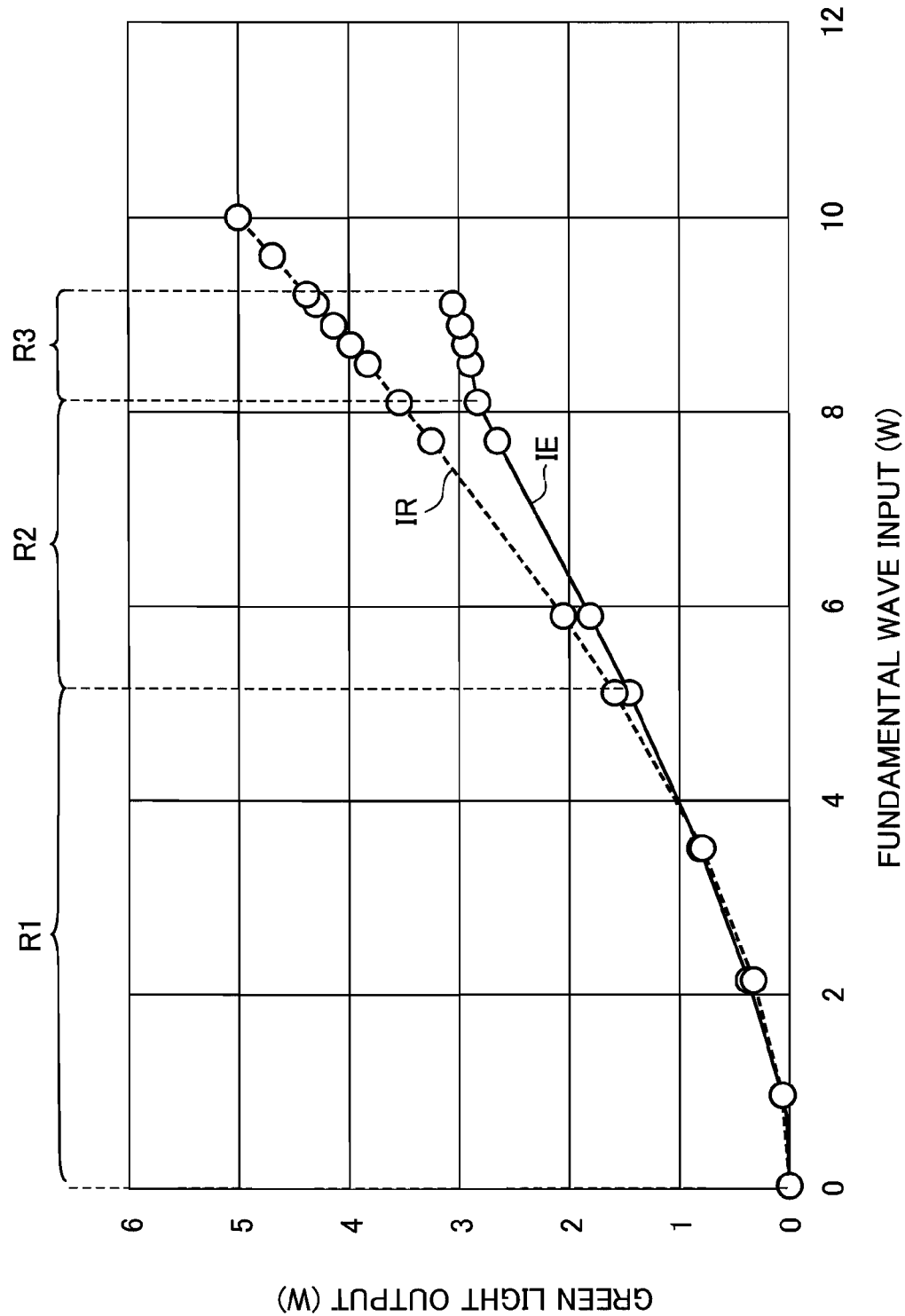
FIG. 9 is a graph showing measurement values and theoretical values of the input/output characteristic of the wavelength conversion element of this embodiment using the $LiNbO_3$ crystal doped with 5.6 mol % of Mg.

Next, a relationship between the output and the ultraviolet light induced green light absorption was studied for the above wavelength conversion element. FIG. 8 is a graph showing measurement values and theoretical values of the input/output characteristic of a conventional wavelength conversion element using the LiNbO$_3$ crystal doped with 5.0 mol % of Mg, and FIG. 9 is a graph showing measurement values and theoretical values of the input/output characteristic of the wavelength conversion element of this embodiment using the LiNbO$_3$ crystal doped with 5.6 mol % of Mg. In FIGS. 8 and 9, the wavelength of the fundamental wave used for measurement and calculation is 1084 nm and the element length is 25 mm. The theoretical values were calculated using a method disclosed in "T. Suhara and M. Fujimura: Waveguide Nonlinear-Optic Devices (Springer, Berlin, 2003), p. 208" and values corresponding to the respective elements were used for conversion efficiency and the like.

First, in the conventional wavelength conversion element using the LiNbO$_3$ crystal doped with 5.0 mol % of Mg, the input/output characteristic given by the theoretical values formed a curve CR, wherein inputs and outputs were substantially proportional to each other as shown in FIG. 8. On the other hand, the input/output characteristic given by the measurement values formed a curve CE, wherein the curves CR, CE substantially coincided in a region r1 where the green light output was below 1 W, the curve CE deviated from the curve CR to reduce the green light output in a region r2 where the green light output was 1 W or more, the curve CE largely deviated from the curve CR to make the green light output unstable in a region r3 where the green light output was 1.75 W or more. As a result, it was found out that the ultraviolet light induced green light absorption markedly occurred in the conventional wavelength conversion element when the output thereof becomes 1 W or more.

Next, in the wavelength conversion element of this embodiment using the LiNbO$_3$ crystal doped with 5.6 mol % of Mg, the input/output characteristic given by the theoretical values formed a curve IR as shown in FIG. 9, wherein inputs and outputs were substantially proportional to each other similar to the above. On the other hand, the input/output characteristic given by the measurement values formed a curve IE, wherein a region R1 where the curves IR, IE substantially coincided was extended to a range where the green light output was 1.5 W, and a region R2 where the curve IE deviated from the curve IR, but the green light could be stably outputted was also extended to a range where the green light output was 2.9 W. As a result, in the wavelength conversion element of this embodiment, the ultraviolet light induced green light absorption, which occurs when the output is 1 W or more, could be suppressed and wavelength conversion efficiency could be improved by as much as the green light absorption was reduced.

From the above theoretical values and measurement values, this wavelength conversion element preferably outputs laser light having an average output of 1 W or more, more preferably outputs laser light having an average output of 1.5 W or more and even more preferably outputs laser light having an average output of 1.75 W or more. In this case, the ultraviolet light induced green light absorption can be suppressed, and the wavelength conversion efficiency can be improved by reducing the green light absorption.

Figure 10:
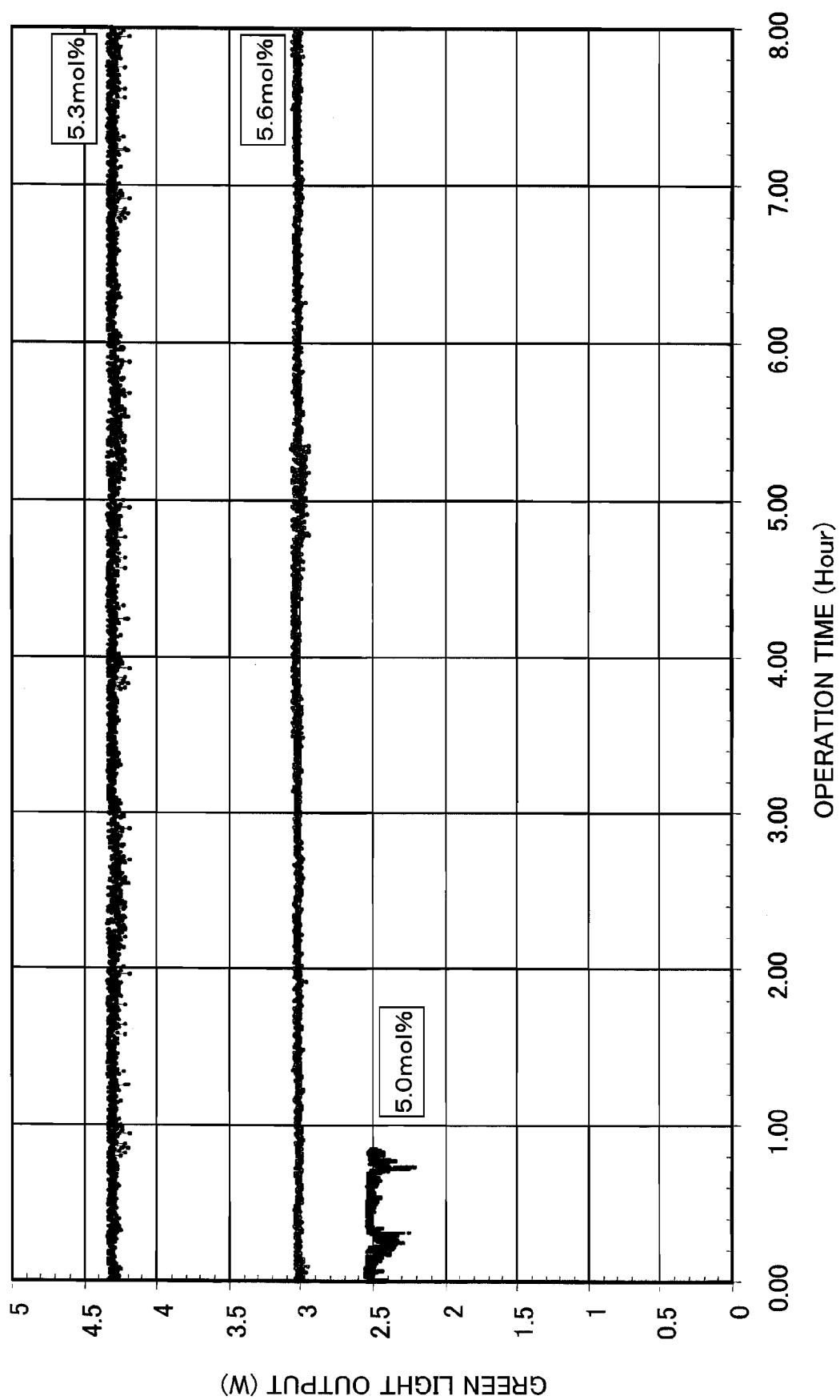
FIG. 10 is a plot graph showing output variations when green light was generated in the case where wavelength conversion elements using $LiNbO_3$ crystals doped with 5.3 Mol % of Mg, 5.6 mol % of Mg and 5.0 mol % of Mg were used.

Next, output stability at high output was studied. FIG. 10 is a plot graph showing output stability at high outputs of the wavelength conversion elements using $LiNbO_3$ crystals doped with 5 mol % of Mg, 5.3 Mol % of Mg and 5.6 mol % of Mg. It can be understood that an output decrease caused by the element deterioration did not occur for eight hours at the time of generating green light of 3 W in the wavelength conversion element using the $LiNbO_3$ crystal doped with 5.6 mol % of Mg. Further, it can be understood that an output decrease caused by the element deterioration did not occur for eight hours at the time of generating green light of 4.3 W in the wavelength conversion element using the $LiNbO_3$ crystal doped with 5.3 mol % of Mg. On the other hand, the wavelength conversion element using the $LiNbO_3$ crystal doped with 5 mol % of Mg was unstable even at the time of generating green light of 2.5 W. Since the influence of heat generation by the green light absorption can be reduced by setting the doping concentration of Mg to 5.3 mol % and 5.6 mol % in this way, output stability can also be improved.

Figure 11:
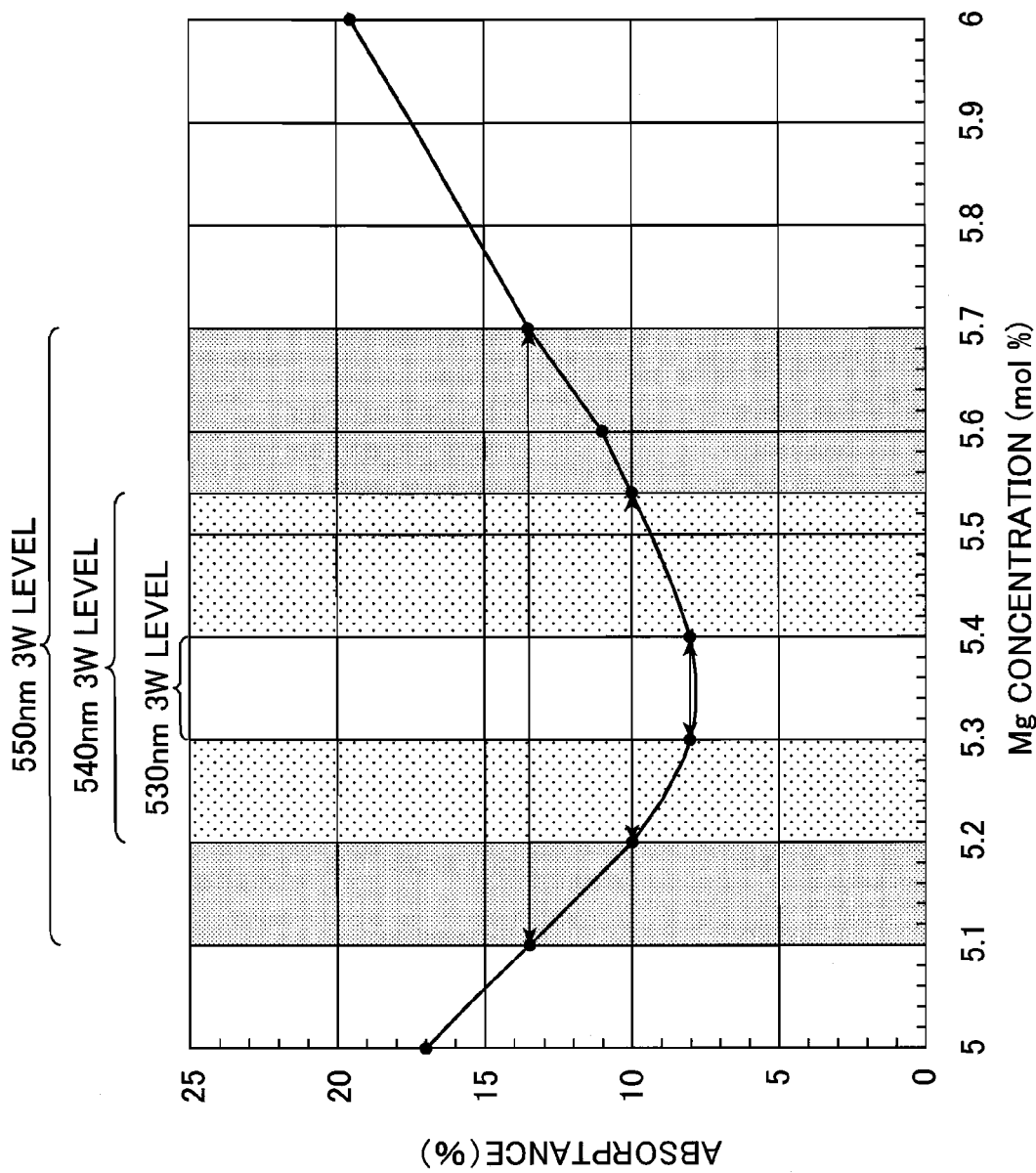
FIG. 11 is a graph showing a measurement result on a relationship between the concentration of Mg and the absorptance of green light in the wavelength conversion element according to the first embodiment of the invention.

Next, an optimal range of the doping concentration of Mg in the wavelength conversion element using the $LiNbO_3$ crystal was studied using the wavelength conversion specifying/evaluating optical system shown in FIG. 6. FIG. 11 is a graph showing a measurement result on the relationship between the Mg concentration of the wavelength conversion element using the $LiNbO_3$ crystal and the absorptance of the green light, wherein black circles represent actual measurement results on the absorptance of the green light in relation to each concentration of Mg and a solid line is a curve smoothly connecting the respective measurement points.

As shown in FIG. 11, in the wavelength conversion elements using the $LiNbO_3$ crystals, green light having a wavelength of 550 nm could be outputted to have a level of 3 W while ensuring 86.5% or higher of the transmittance of the green light as an example of the visible light when the Mg concentration was 5.10 to 5.70 mol %. Further, green light having a wavelength of 540 nm could be outputted to have a level of 3 W while ensuring 90.0% or higher of the transmittance of the green light when the Mg concentration was 5.20 to 5.54 mol %. Furthermore, green light having a wavelength of 530 nm could be outputted to have a level of 3 W while ensuring 92.0% or higher of the transmittance of the green light when the Mg concentration was 5.30 to 5.40 mol %. It should be noted that the crystal was broken outside the above range.

Next, an optimal range of the depth W of the poling portions of the wavelength conversion element using the $LiNbO_3$ crystal doped with Mg within the above range was studied.

Figure 12:
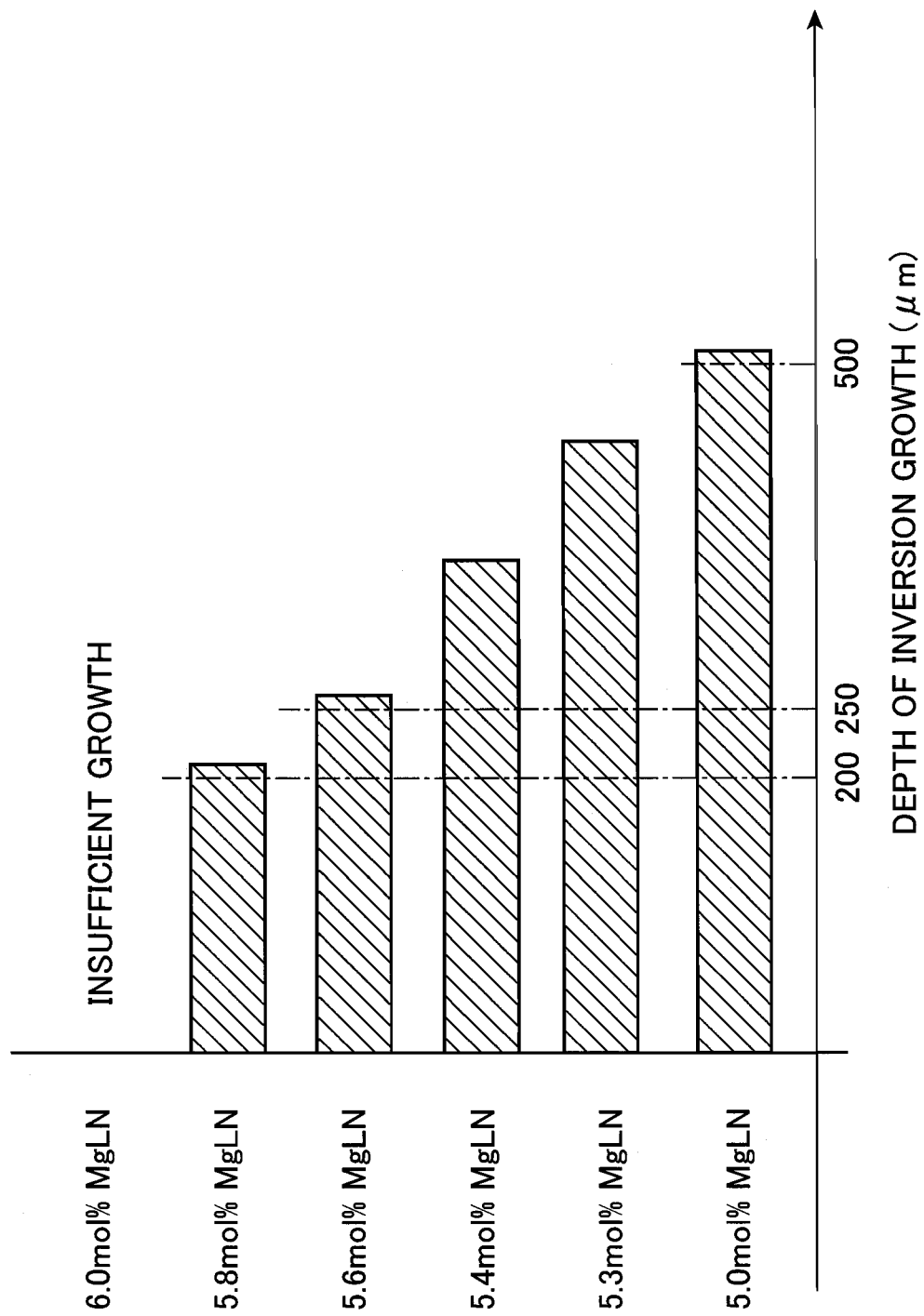
FIG. 12 is a graph showing a measurement result on a relationship between the concentration of Mg and the depth of poling portions in the wavelength conversion element according to the first embodiment of the invention.

FIG. 12 is a graph showing a measurement result on the relationship between the Mg concentration of the wavelength conversion element using the $LiNbO_3$ crystal and the depth W of the poling portions.

As shown in FIG. 12, in the wavelength conversion element using the $LiNbO_3$ crystal, the poling portions did not grow to have a sufficient depth when the Mg concentration was 6.00 mol %, but grew to have a depth of 200 μm or larger when the Mg concentration was 5.80 mol %, grew to have a depth of about 250 μm or larger when the Mg concentration was 5.60 mol %, 5.40 mol % and 5.30 mol %, and grew to have a depth of about 500 μm or larger when the Mg concentration was 5.00 mol %.

In the case of using the wavelength conversion element using the above $LiNbO_3$ crystal as a polarization inversion element, the depth W of the poling portions needs to be 200 μm or larger in consideration of margins for adjustment in order to make a beam to be emerged from the polarization inversion element have a diameter of 120 μm. In order to satisfy this condition, the Mg concentration of the poling portions of the wavelength conversion element using the $LiNbO_3$ crystal is preferably 5.80 mol % or lower, more preferably 5.60 mol % or lower from the results shown in FIG. 12.

From the experimental results shown in FIGS. 11 and 12, the Mg concentration is preferably 5.10 to 5.70 mol % in the wavelength conversion element using the $LiNbO_3$ crystal. In this case, it is possible to ensure the diameter of 120 μm or larger of a beam to be emerged from the wavelength conversion element and to output green light having a wavelength of 550 nm to have a level of 3 W while ensuring 86.5% or higher of the transmittance of the green light.

Further, in the wavelength conversion element using the $LiNbO_3$ crystal, the Mg concentration is more preferably 5.20 to 5.54 mol %. In this case, it is possible to ensure the diameter of 120 μm or larger of a beam to be emerged from the wavelength conversion element and to output green light having a wavelength of 540 nm to have a level of 3 W while ensuring 90.0% or higher of the transmittance of the green light.

Furthermore, in the wavelength conversion element using the $LiNbO_3$ crystal, the Mg concentration is most preferably 5.30 to 5.40 mol %. In this case, it is possible to ensure the diameter of 120 μm or larger of a beam to be emerged from the wavelength conversion element and to output green light having a wavelength of 530 nm to have a level of 3 W while ensuring 92.0% or higher of the transmittance of the green light.

Figure 30:
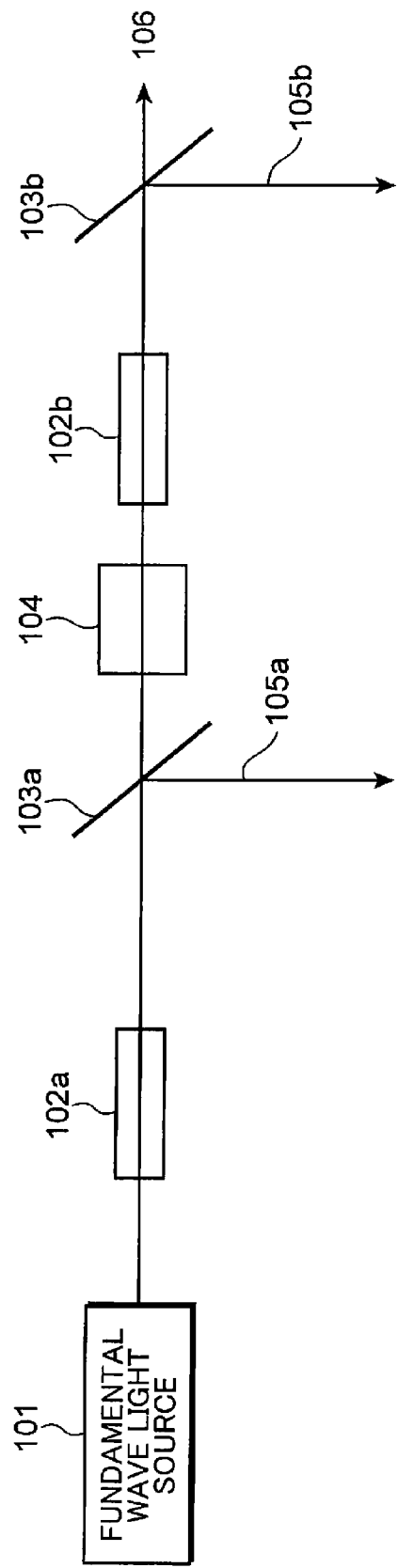
FIG. 30 is a diagram showing the construction of a conventional wavelength converter.

By using the wavelength conversion element of this embodiment in this way, it becomes possible to simultaneously facilitate both the task of avoiding the optical damage and the task of reducing the ultraviolet light induced green light absorption, which has been conventionally difficult to realize. Further, it can be known that the construction shown in FIG. 6 is more simplified in the entire construction and its members as compared to the one of patent literature 3 shown in FIG. 30. Therefore, the simplification and lower cost of the device can be realized by using the wavelength conversion element of this embodiment.

Second Embodiment

A wavelength conversion element according to a second embodiment of the present invention converts infrared light into green light using a lithium tantalate crystal having a congruent composition and doped with magnesium oxide (MgO) as a nonlinear optical crystal used for wavelength conversion. This wavelength conversion element is described in detail below.

Lithium tantalate used in this embodiment is produced by a method similar to the one of the first embodiment. The Mg concentration (Mg content ratio) of the crystal was set to 1.0 mol %, 3.0 mol %, 5.0 mol %, 5.3 mol %, 5.6 mol %, 6.0 mol %, 7.0 mol % and 10.0 mol % in a pulled-up state.

First of all, the crystal composition of Mg-doped $LiTaO_3$ as a crystal substrate was studied. $LiTaO_3$ crystals are classified into congruent compositions and stoichiometric compositions depending on the Li/Ta ratio. Stoichiometric compositions have a Li/Ta ratio of about 50/50 and called perfect crystals, whereas the Li/Ta ratios of congruent compositions deviate from 50/50.

Thus, the Mg-doped $LiTaO_3$ crystal is preferably a congruent composition, and the Li/Ta ratio, which is a mol ratio of Li and Ta contained in the substrate crystal is more preferably 94.2±2%. In this case, since the Li/Ta ratio of the congruent composition deviates from 50/50, there are many crystal defects and it is possible to add high concentration of Mg to be located in the crystal defects. As a result, it became easier to add 5 mol % or more of Mg necessary for characteristics and it was possible to produce a $LiTaO_3$ crystal doped at a high concentration of Mg and having high crystallinity. The Li/Ta ratio of the congruent composition is preferably about 94.2±2%. It was easier to pull up this crystal having a congruent composition, which enabled lower cost.

Figure 3:
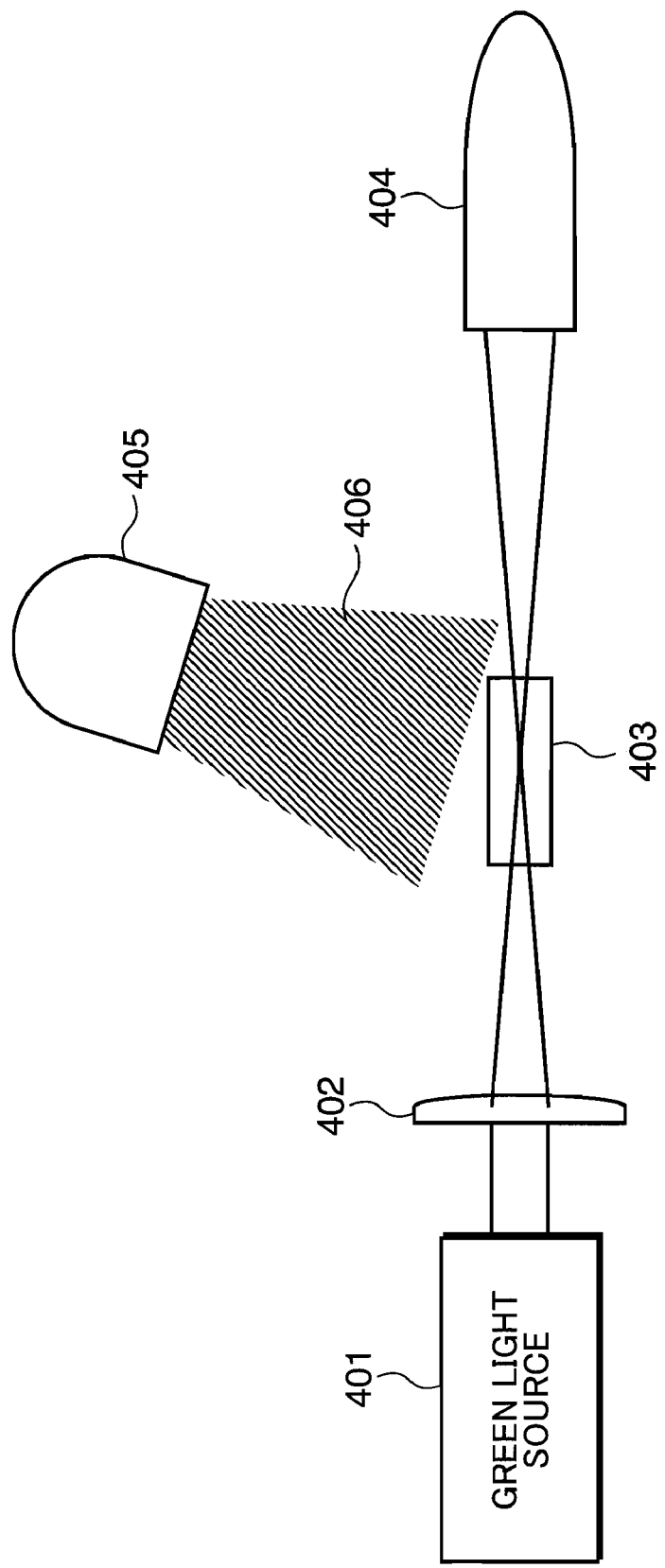
FIG. 3 is a diagram showing a measuring optical system of an evaluation apparatus for evaluating ultraviolet light induced green light absorption.
Figure 13:
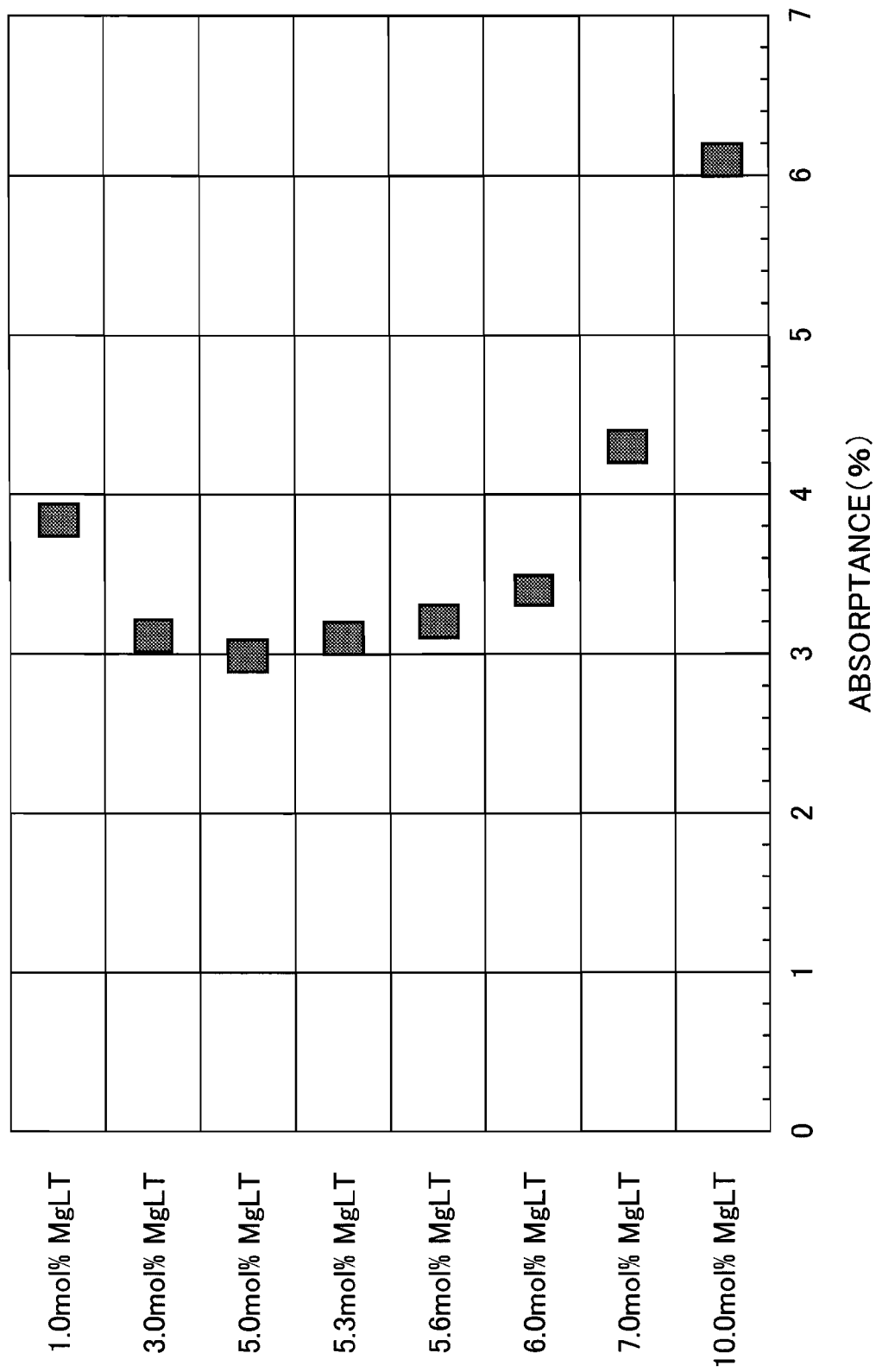
FIG. 13 is a graph showing evaluation results of ultraviolet light induced green light absorption with the kinds and concentrations of impurity as parameters in a $LiTaO_3$ crystal doped with Mg used for a wavelength conversion element according to a second embodiment of the invention.

Next, the absorptance of green light at the time of irradiating ultraviolet light was measured using the evaluation apparatus shown in FIG. 3 and measurement results are summarized in FIG. 13. First, a reduction in the transmittance of the green light was suppressed to about 5% or lower when the ultraviolet light was irradiated as compared to when the ultraviolet light was not irradiated in $LiTaO_3$ crystals having a congruent composition and doped with 1.0 mol % of Mg, 3.0 mol % of Mg, 5.0 mol % of Mg, 5.3 mol % of Mg, 5.6 mol % of Mg, 6.0 mol % of Mg and 7.0 mol % of Mg (1.0 mol % MgLT, 3.0 mol % MgLT, 5.0 mol % MgLT, 5.3 mol % MgLT, 5.6 mol % MgLT, 6.0 mol % MgLT and 7.0 mol % MgLT). On the other hand, it can be understood that the transmittance of the green light is reduced by 5% or more when the ultraviolet light was irradiated as compared to when the ultraviolet light was not irradiated in the $LiTaO_3$ crystal doped with 10 mol of Mg (10.0 mol % MgLT).

Next, using the above crystal, the wavelength conversion element of this embodiment was fabricated in the same manner as the wavelength conversion element shown in FIG. 5. Since the construction of the wavelength conversion element of this embodiment is the same as the one shown in FIG. 5, this construction is described with reference to FIG. 5.

In the wavelength conversion element of this embodiment, poling portions 2 are periodically formed on a Mg-doped $LiTaO_3$ substrate having a principal surface substantially normal to a Z-axis of the crystal. This wavelength conversion element is an element that satisfies a phase matching condition and converts fundamental wave having a wavelength λ, into second harmonic having a wavelength λ/2 by passing light through the periodically formed poling portions 2. Here, λ/3 is 400 nm or shorter, and the phase matching wavelength λ is 980 nm or shorter. The $LiTaO_3$ substrate used in this element is doped with Mg. The periodical poling portions 2 are formed by the process of applying an electric field between periodical pattern electrodes formed on a +Z surface of the substrate and electrodes formed on a −Z surface of the substrate, and the applied electric field between the electrodes is 4 kV/mm or smaller.

The construction of the above wavelength conversion element (MgLT) capable of highly efficient conversion is described. The inversion width, depth and period of the poling portions 2 are W, D and Λ. The poling portions 2 are formed to extend from a +Z surface toward a −Z surface. A stripe direction of the poling portions 2 is a Y-axis direction, and the stripe direction of the poling portions 2 is substantially parallel to Y-axis. It is desirable that the stripe direction of the poling portions 2 and the Y-axis direction define an angle between ±5°. This is because polarization inversion becomes more nonuniform to considerably reduce the conversion efficiency of the wavelength conversion element if this angle exceeds 5°. The outer surfaces of the wavelength conversion element desirably include a surface substantially normal to the C-axis of the crystal (Z-axis). Since the poled structure grows along the C-axis, the deep poled structure can be formed to sufficiently increase the overlap with the beam of the fundamental wave passing through the wavelength conversion element.

Figure 14:
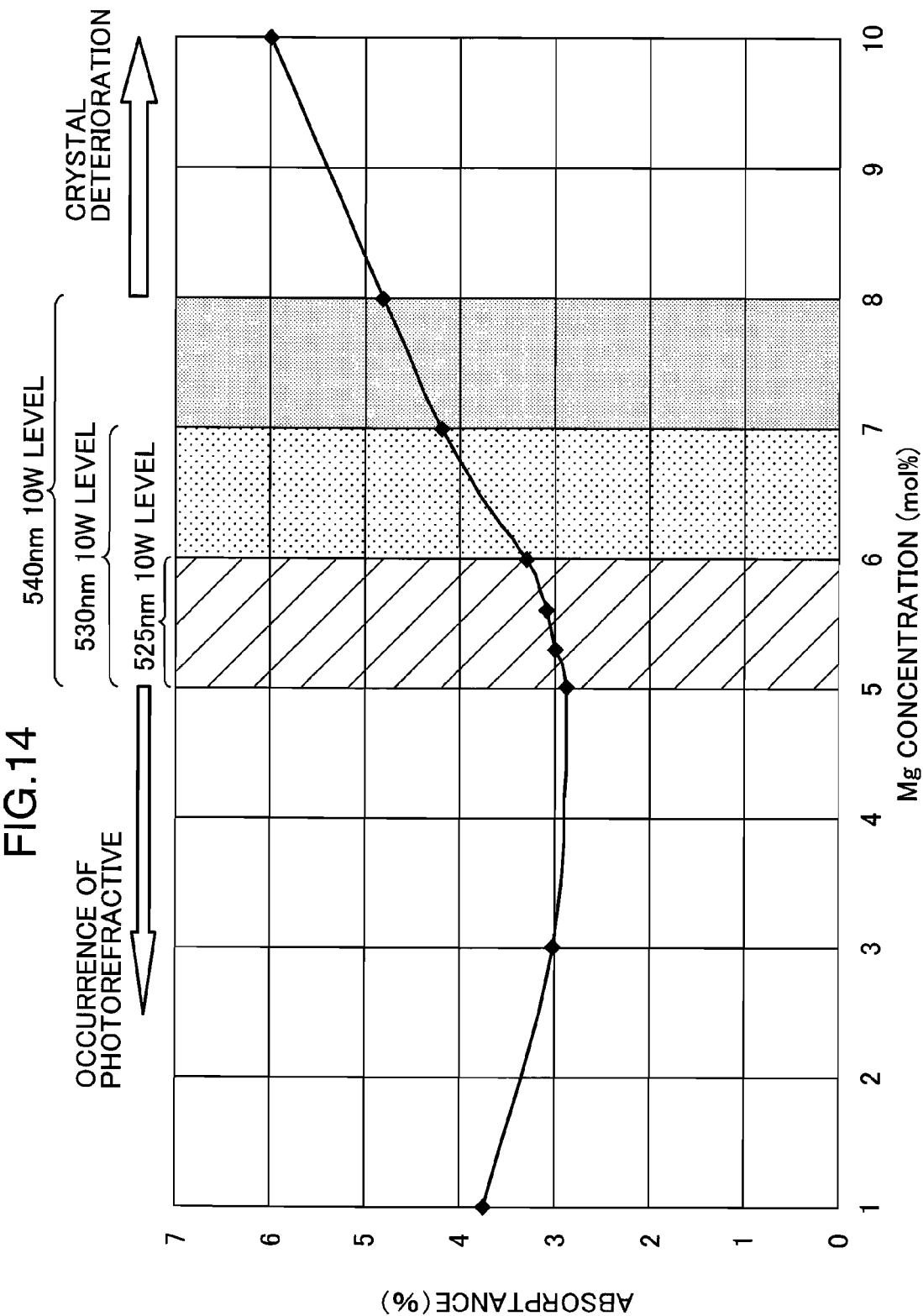
FIG. 14 is a graph showing a measurement result on a relationship between the concentration of Mg and the absorptance of green light in the wavelength conversion element according to the second embodiment of the invention.

Next, an optimal range of the doping concentration of Mg in the wavelength conversion element using the $LiTaO_3$ crystal was studied using the wavelength conversion specifying/evaluating optical system shown in FIG. 6. FIG. 14 is a graph showing a measurement result on the relationship between the Mg concentration of the wavelength conversion element using the $LiTaO_3$ crystal and the absorptance of the green light, wherein black circles represent actual measurement results on the absorptance of the green light in relation to each concentration of Mg and a solid line is a curve smoothly connecting the respective measurement points.

As shown in FIG. 14, in the wavelength conversion element using the $LiTaO_3$ crystal, green light having a wavelength of 540 nm could be outputted to have a level of 10 W while ensuring 95.2% or higher of the transmittance of the green light when the Mg concentration was 5.0 to 8.0 mol %. Further, green light having a wavelength of 530 nm could be outputted to have a level of 10 W while ensuring 95.8% or higher of the transmittance of the green light when the Mg concentration was 5.0 to 7.0 mol %. Furthermore, green light having a wavelength of 525 nm could be outputted to have a level of 10 W while ensuring 96.7% or higher of the transmittance of the green light when the Mg concentration was 5.0 to 6.0 mol %. On the other hand, it was found out that optical damage (photorefractive) occurred if the Mg concentration was below 5.0 mol % and that crystallinity was deteriorated if it exceeded 8.0 mol %. Either case was understood to be undesirable.

Further, in the wavelength conversion element using the $LiTaO_3$ crystal, slight optical damages were observed in some experiments when the Mg concentration was 5.0 mol %. Thus, the above respective ranges are more preferably 5.1 to 8.0 mol %, 5.1 to 7.0 mol % and 5.1 to 6.0 mol %. In this case, optical damages can be reliably suppressed.

Further, from experiments similar to the above, it was found out that an output reduction by the ultraviolet light induced green light absorption occurred in the wavelength conversion element in which the wavelength of the fundamental wave was 1200 nm or shorter and the period Λ of the poling portions 2 was 11 μm or shorter. In this case, in the wavelength conversion element having a periodically poled structure and having a doped amount of Mg of 5.0 to 8.0 mol %, optical damage resistance by Mg doping could be improved and an increase in the ultraviolet light induced green light absorption could be suppressed. Therefore, high output and high efficiency resistance could be realized, and a high output of about 10 W could be stably obtained with the power density of the SHG (second harmonic generation) light of 1 MW/cm$^2$ or more.

Figure 15:
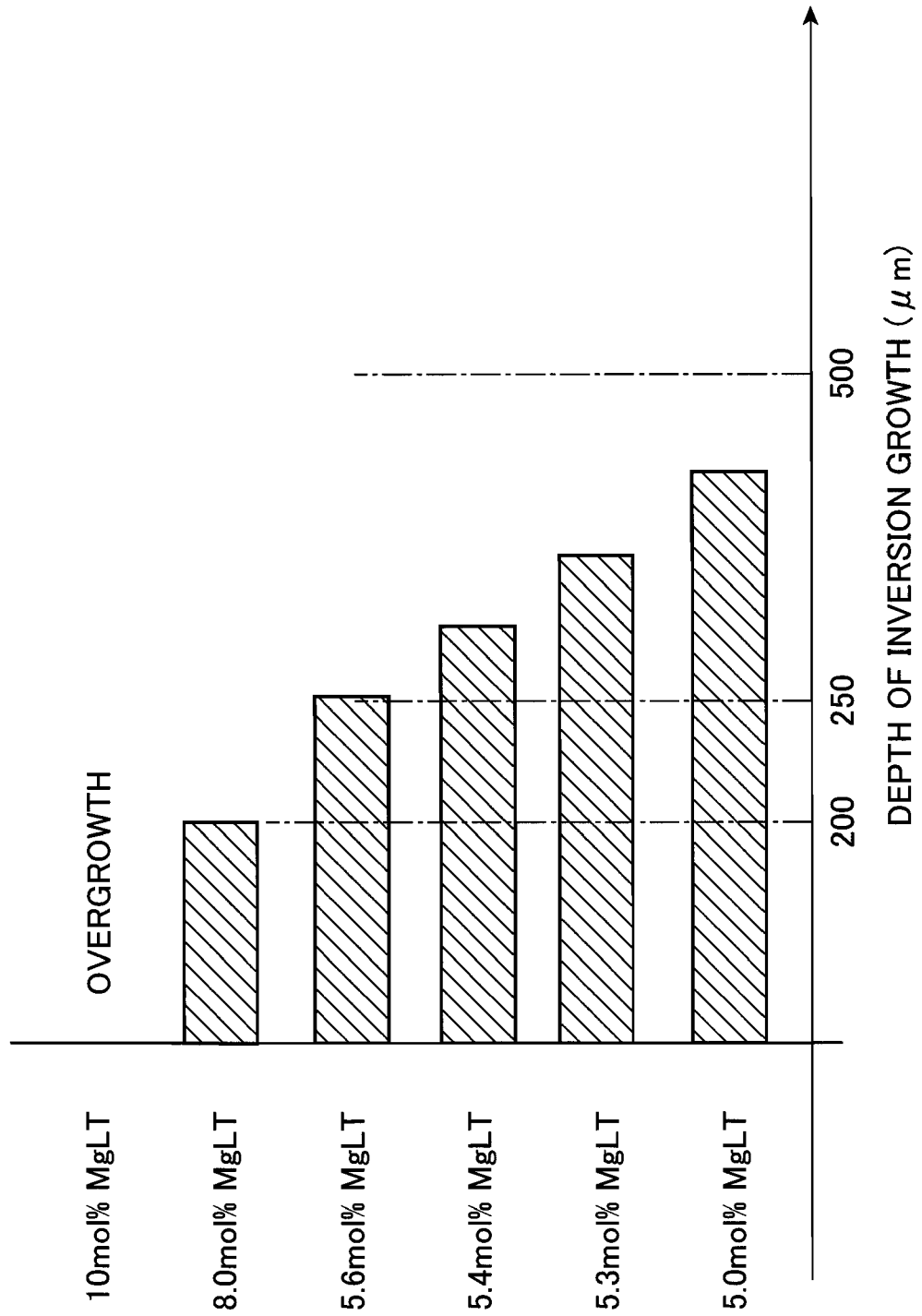
FIG. 15 is a graph showing a measurement result on a relationship between the concentration of Mg and the depth of poling portions in the wavelength conversion element according to the second embodiment of the invention.

Next, an optimal range of the depth W of the poling portions of the wavelength conversion element using the LiTaO$_3$ crystal doped with Mg within the above range was studied. FIG. 15 is a graph showing a measurement result on the relationship between the Mg concentration and the depth W of the poling portions of the wavelength conversion element using the LiTaO$_3$ crystal.

As shown in FIG. 15, in the wavelength conversion element using the LiTaO$_3$ crystal, the poling portions did not grow to have a sufficient depth when the Mg concentration was 10.00 mol %, but grew to have a depth of about 200 μm or larger when the Mg concentration was 8.0 mol % and grew to have a depth of about 250 μm or larger when the Mg concentration was 5.6 mol %, 5.4 mol %, 5.3 mol % and 5.0 mol %.

In the case of using the wavelength conversion element using the above LiTaO$_3$ crystal as a polarization inversion element, the depth W of the poling portions needs to be 200 μm or larger in consideration of margins for adjustment in order to make a beam to be emerged from the polarization inversion element have a diameter of 120 μm. In order to satisfy this condition, the Mg concentration of the poling portions of the wavelength conversion element using the LiTaO$_3$ crystal is preferably 8.0 mol % or lower, more preferably 5.6 mol % or lower from the results shown in FIG. 15.

From the experimental results shown in FIGS. 14 and 15, the Mg concentration is preferably 5.0 to 8.0 mol % in the wavelength conversion element using the LiTaO$_3$ crystal. In this case, it is possible to ensure the diameter of 120 μm or larger of a beam to be emerged from the wavelength conversion element and to output green light having a wavelength of 540 nm to have a level of 10 W while ensuring 95.2% or higher of the transmittance of the green light.

Further, in the wavelength conversion element using the LiTaO$_3$ crystal, the Mg concentration is more preferably 5.0 to 7.0 mol %. In this case, it is possible to ensure the diameter of 120 μm or larger of a beam to be emerged from the wavelength conversion element and to output green light having a wavelength of 530 nm to have a level of 10 W while ensuring 95.8% or higher of the transmittance of the green light.

Furthermore, in the wavelength conversion element using the LiTaO$_3$ crystal, the Mg concentration is most preferably 5.0 to 6.0 mol %. In this case, it is possible to ensure the diameter of 120 μm or larger of a beam to be emerged from the wavelength conversion element and to output green light having a wavelength of 525 nm to have a level of 10 W while ensuring 96.7% or higher of the transmittance of the green light.

By using the wavelength conversion element of this embodiment in this way, it becomes possible to simultaneously facilitate both the task of avoiding optical damage and the task of reducing the ultraviolet light induced green light absorption, which has been conventionally difficult to realize. Further, it can be known that the construction shown in FIG. 6 is more simplified in the entire construction and its members as compared to the one of patent literature 3 shown in FIG. 30. Therefore, the simplification and lower cost of the device can be realized by using the wavelength conversion element of this embodiment.

Further, in the case of using the LiTaO$_3$ crystal as in this embodiment, the nonlinear optical constant becomes about one third of that of the LiNbO$_3$ crystal and the absorptance of the visible light is sufficiently smaller than the LiNbO$_3$ crystal, wherefore more green light can be emitted. As a result, the wavelength conversion element of this embodiment can generate a pulse having a higher crest value and, hence, is advantageous to pulse modulation to be described later.

Next, the shape of the poling portions 2 was studied in detail. In this embodiment is adopted a method for stopping the growth of the poling portions 2 at intermediate positions of the substrate so that the poling portions 2 do not penetrate to the underside. By controlling the growth of the poling portions 2 to prevent penetration and inversion, it became possible to suppress a resistance reduction between the electrodes, to uniformly apply an electric field necessary for polarization inversion within electrode surfaces and to form a uniform poled structure.

In this way, as the poled structure, the depths D of the poling portions 2 are preferably smaller than the thickness of the substrate (substrate length in Z-direction) and 90% or more of a poled area where the poling portions 2 are formed preferably do not penetrate up to the underside. In other words, a uniform poled structure can be formed if the poling portions 2 do not penetrate in 90% or more of the electrode area.

In order to prevent the penetration of the poling portions 2 up to the underside, it is preferable to increase the thickness of the substrate. For example, it becomes possible to prevent the penetration of the polarization inversion and to form a uniform short periodic structure by increasing the thickness of the substrate to 1 mm or larger. Therefore, a high-efficiency wavelength conversion element could be realized.

The average of the depths D of the poling portions 2 is preferably within the 40 to 95% range of the thickness of the substrate. Within this range, the substrate can be effectively used. On the other hand, upon exceeding 95%, the resistance of the poling portions 2 is drastically decreased, wherefore it is difficult to form a uniform poled structure. Upon falling below 40%, the poling portions 2 become largely nonuniform and the usable and effective depths D of the poling portions 2 are considerably reduced.

It was found out that, in MgLT, the poling portions 2 are wedge-shaped in depth direction from the top surface of the substrate and the width of the poling portions 2 decrease as the poling portions 2 get deeper. In a wavelength conversion element having a 1$^{st}$-order poling period, the duty ratio W/Λ of the width W and the period Λ of the poling portions 2 is maximized at 50%. An effective cross-sectional area in the case of causing a condensed beam to be incident on the poling portions 2 as a bulky wavelength conversion element is an area where the duty ratio W/Λ of the width W and the period Λ of the poling portions 2 is 50%±10%.

Figure 16:
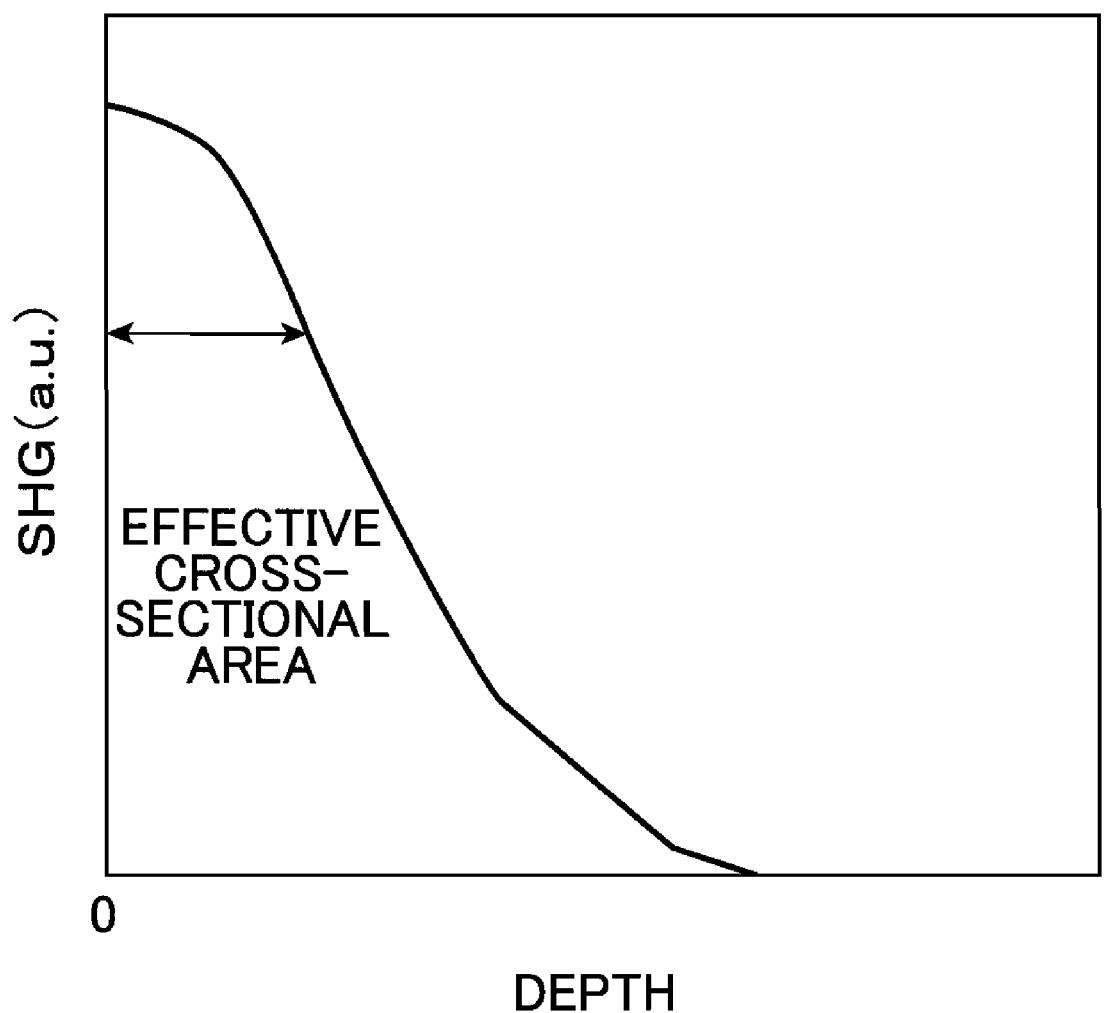
FIG. 16 is a graph showing an example of an effective cross-sectional area in a direction of depth W in the case where a duty ratio $W/\Lambda$ of width W of the poling portions to period $\Lambda$ is 50% on the top surface of the substrate.
Figure 17:
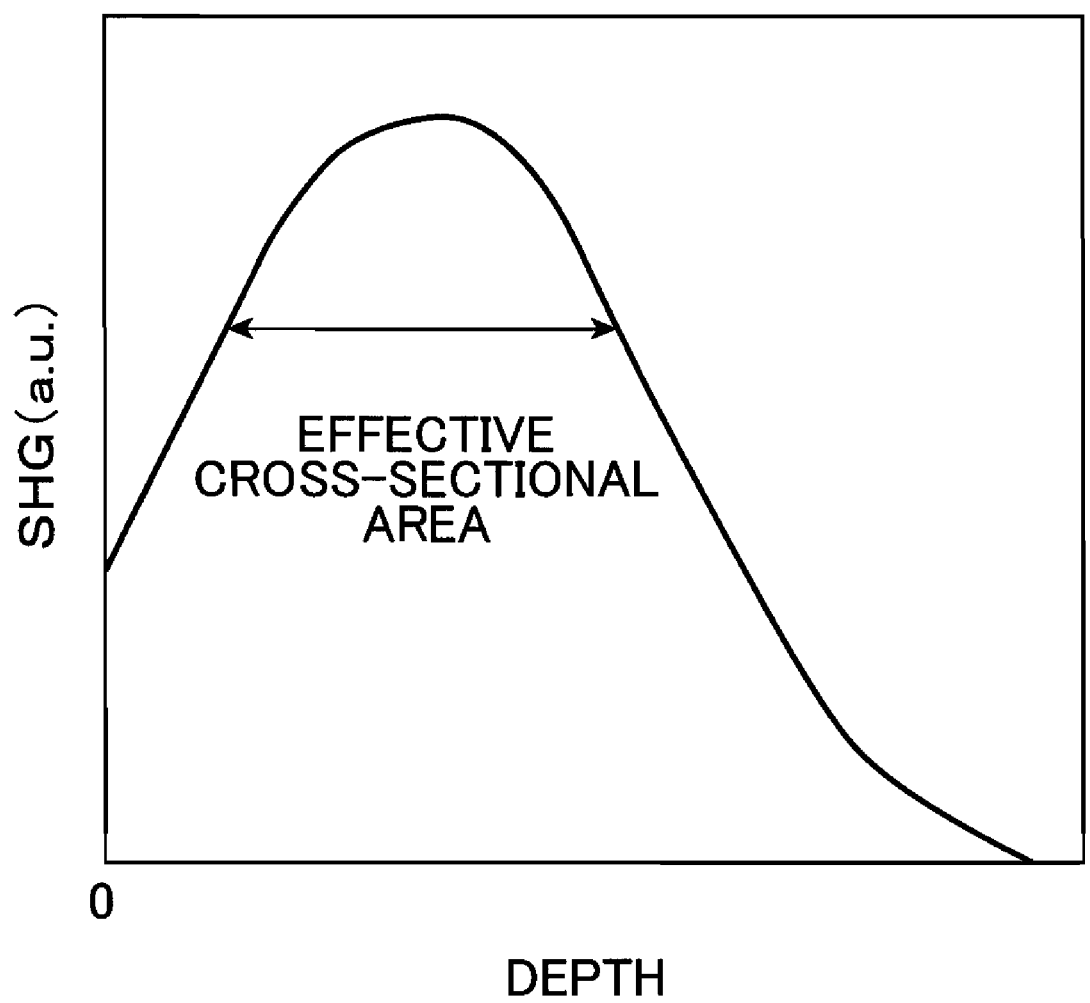
FIG. 17 is a graph showing an example of an effective cross-sectional area in the direction of depth W in the case where the duty ratio $W/\Lambda$ of width W of the poling portions to period $\Lambda$ exceeds 50% on the top surface of the substrate.

However, if the duty ratio W/Λ of the width W and the period Λ of the poling portions 2 becomes 50% on the top surface of the substrate, a second harmonic (SHG) output is maximized at the top surface of the substrate, but the effective cross-sectional area in the direction of depth W becomes smaller as shown in FIG. 16. On the other hand, if the duty ratio W/Λ of the width W and the period Λ of the poling portions 2 exceed 50% on the top surface of the substrate, the effective cross-sectional area in the direction of depth W markedly increases as shown in FIG. 17. If the effective cross-sectional area increases, it is possible not only to facilitate beam adjustments, but also to make the usable beam larger, wherefore the power densities of the fundamental wave and the second harmonic can be reduced and high output resistance is remarkably improved. Accordingly, the width W of the poling portions 2 on the principal surface of the substrate is preferably larger than the width (Λ−W) of polarization non-inverting portions.

Further, an aspect ratio (D/W) of the poling portions 2 is preferably 200 or larger. If the aspect ratio is large, an area where the polarization inversion can be effectively used is increased and it is particularly necessary in the short periodic structure.

Next, a construction realizing a higher output wavelength conversion element was considered. An experimental result revealed that an increase in the absorption of green light by ultraviolet rays depended on the wavelength of the ultraviolet rays. The absorption of the green light was increased when the ultraviolet rays lie within a wavelength range of 320 nm to 380 nm. Since wavelengths below 320 nm are those at or below an absorption end of crystals and lights having such wavelengths do not pass through crystals, such wavelengths are thought to have no influence. Accordingly, upon the application of ultraviolet rays having the above wavelengths, the deterioration of the high output characteristic caused by the absorption of the green light was observed.

Figure 18:
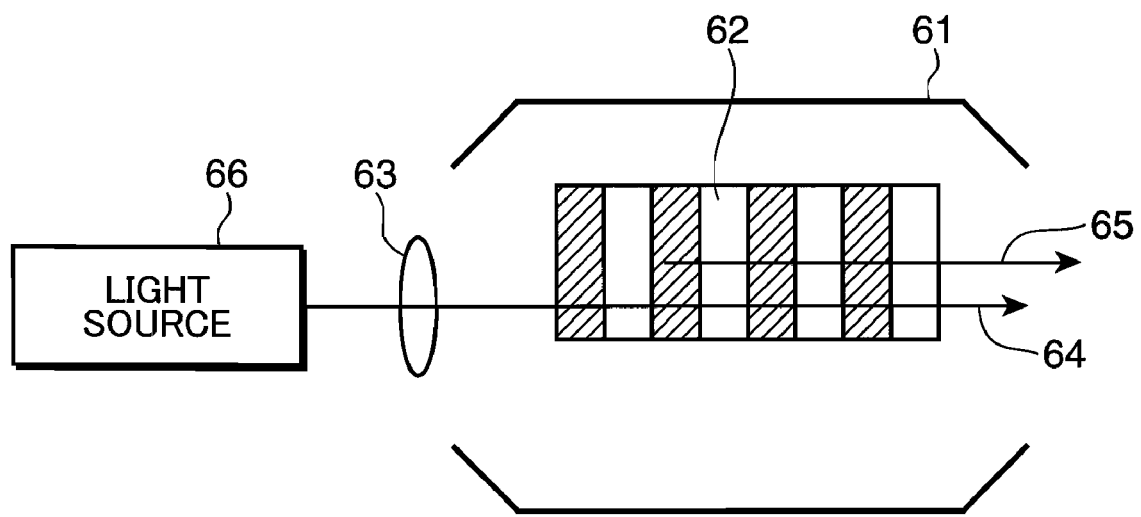
FIG. 18 is a diagram showing a construction example for shielding ultraviolet light outside in the wavelength conversion element according to the second embodiment of the invention.

In order to prevent the deterioration of the high output characteristic by ultraviolet rays outside, the crystal needs to be shielded from the ultraviolet rays outside. In order to prevent the deterioration of the high output characteristic, it is preferable to provide a shield 61 for not transmitting lights having wavelengths of 250 to 400 nm around a periodically poled MgO-doped lithium tantalate ($LiTaO_3$) crystal (PP-MgLT) 62 for the shielding of ultraviolet light from the outside in the case where the PPMgLT 62 converts fundamental wave 65 emitted from a light source 66 into second harmonic (SHG) 65 and outputs the second harmonic 65 as shown in FIG. 18. In other words, it is preferable that the wavelength conversion element includes the shield 61 and is shielded from external lights by the shield 61, and that the shield 61 does not transmit lights having wavelengths of 400 nm or below.

Figure 19:
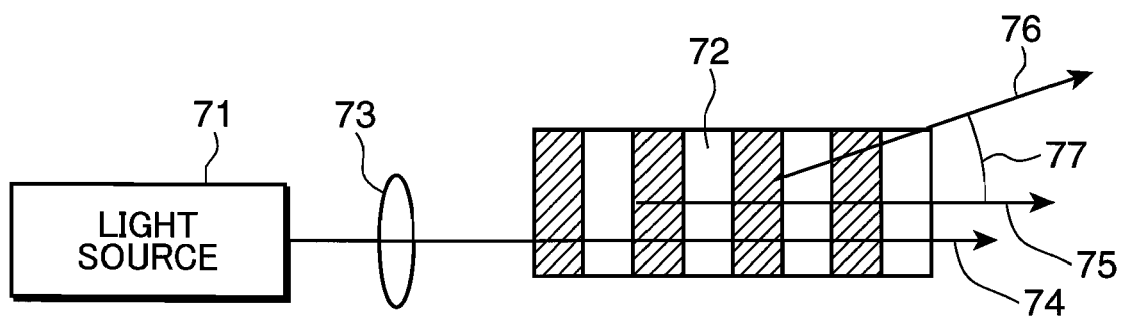
FIG. 19 is a diagram showing that sum frequency generation of fundamental wave and second harmonic is emitted at a walk-off angle.

Next, the deterioration of the high output characteristic caused by the generation of ultraviolet light by sum frequency generation of fundamental wave and second harmonic is described. Even if ultraviolet light from the outside is completely shielded, there are cases where damages occur in the generation of high-output green light. The study of this cause revealed that sum frequency generation (SFG) 76 of fundamental wave 74 from a light source 71 and second harmonic (SHG) 75 emerged from a PPMgLT 72 at a walk-off angle 77 as shown in FIG. 19. The wavelength of the SFG 76 is one third of the wavelength λ of the fundamental wave 74. For example, if the fundamental wave has a wavelength of 1064 nm, the wavelength of the SFG 76 is 355 nm which is the wavelength of ultraviolet rays. It was found that this caused the absorption of the SHG 75 to deteriorate the high output characteristic. The analysis of this property indicates wavelength dependency.

Figure 20:
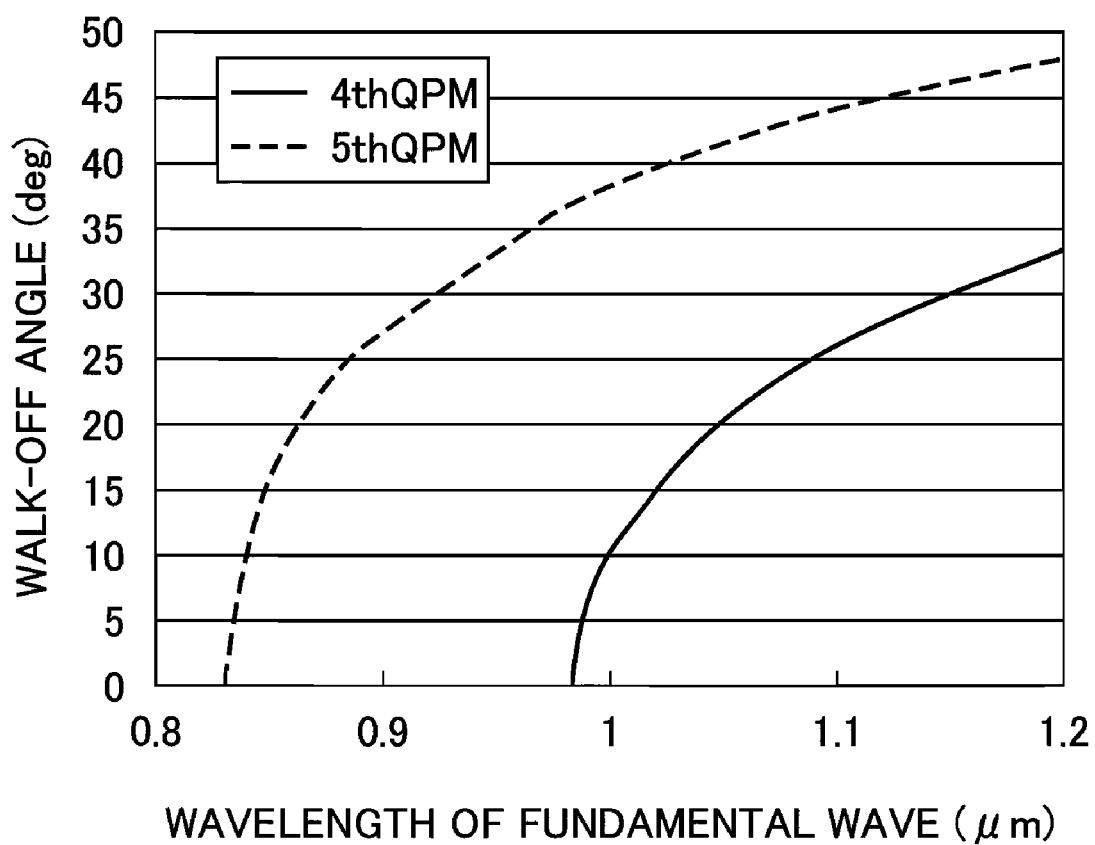
FIG. 20 is a diagram showing a relationship between the wavelength of the fundamental wave and the walk-off angle.

FIG. 20 shows calculation results on the relationship between the wavelength of the fundamental wave and the walk-off angle. The SFG depends on the poling period and the walk-off angle approximates to 0 at several wavelengths. It was found out that the intensity of the SFG became higher and the high output characteristic was considerably reduced if the walk-off angle approximated to 0. Particularly, if the walk-off angle is 15° or smaller, the high output characteristic is more severely deteriorated. Thus, the wavelength of the fundamental wave is preferably 820 nm or below or from 850 to 980 nm or 1020 nm or above. Since the sum frequency generation inside can be reduced within these ranges, a better high output characteristic can be realized.

Solid-state laser light sources and fiber laser light sources can be utilized as a light source for outputting fundamental wave. Further, a high-output short-wavelength light source can be realized by installing the wavelength conversion element of this embodiment in a solid-state laser resonator and utilizing it as an internal resonator type wavelength conversion element. In this case, since the wavelength conversion element (PPMgLT) of this embodiment has a high transmittance characteristic, loss in the resonator can be reduced and highly efficient wavelength conversion is possible.

Third Embodiment

Figure 21:
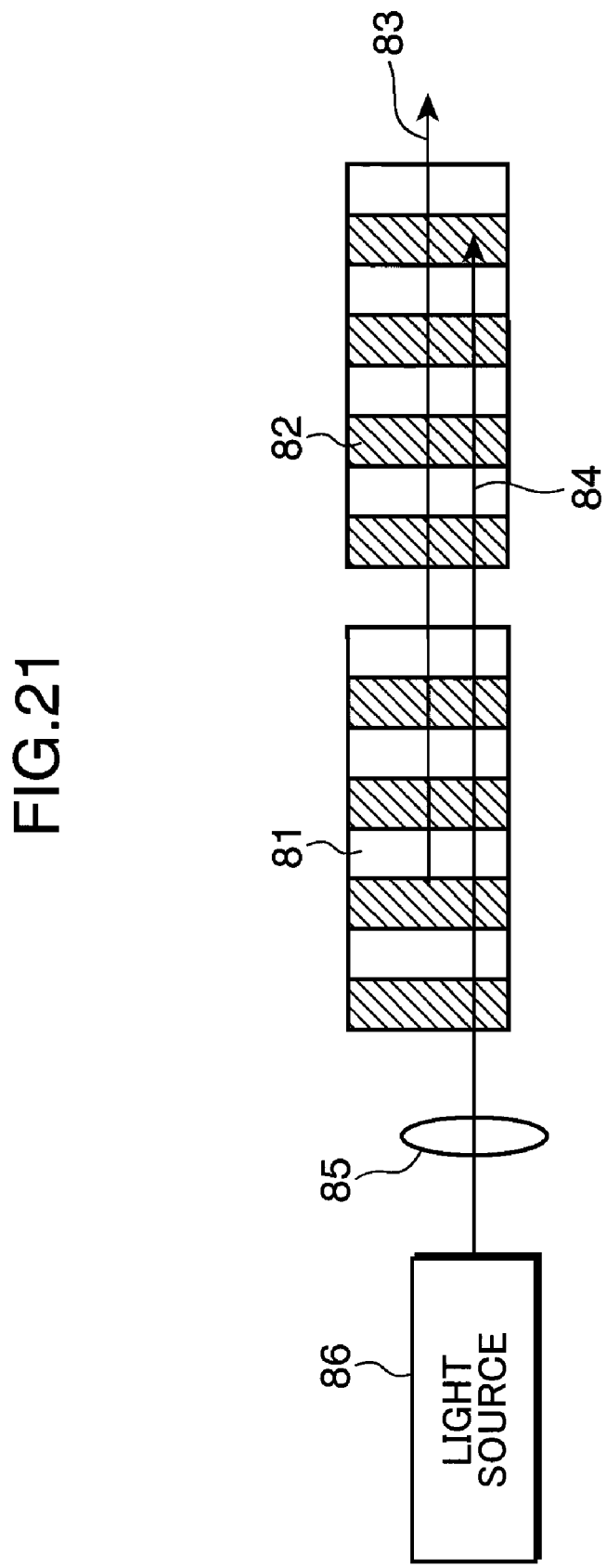
FIG. 21 is a diagram showing the construction of a laser light source using a wavelength conversion element according to a third embodiment of the invention.

Next, a laser light source using a wavelength conversion element according to a third embodiment of the invention is described with reference to FIG. 21. In FIG. 21, fundamental wave 84 emitted from a light source 86 as a coherent light source passes through a condensing optical system 85 and is wavelength-converted by nonlinear optical crystals 81, 82 as a wavelength conversion element to be converted into SHG 83. By this construction, a high-efficiency and high-output wavelength conversion element can be realized. It should be noted that a solid-state laser light source, a fiber laser light source or the like can be utilized as the light source 86 for the fundamental wave 84. Since the fiber laser light source has high beam quality, highly efficient conversion is easily performed by a single-path construction, and a highly efficient short-wavelength light source can be realized by combining the fiber laser light source and the wavelength conversion element of this embodiment.

Mg-doped $LiNbO_3$ (MgLN) has a high nonlinear optical effect and can realize three times as high conversion efficiency as Mg-doped $LiTaO_3$ (MgLT). However, since MgLN has a problem with high output resistance due to the aforementioned ultraviolet light generation, it is difficult to obtain a high output exceeding about 3 W. On the other hand, the conversion efficiency of Mg-doped $LiTaO_3$ is lower than that of Mg-doped $LiNbO_3$, but optical damage resistance and high output resistance are remarkably improved by Mg doping.

Accordingly, by combining these two crystals, a wavelength conversion element having high conversion efficiency and high output can be realized. The conversion efficiency can be improved by lengthening the wavelength conversion element, but the wavelength tolerance of convertible fundamental waves becomes narrow in range if the element is lengthened, wherefore highly efficient conversion is difficult. Further, since the element becomes larger, it is disadvantageous in terms of miniaturization and lower cost.

As shown in FIG. 21, a periodically poled MgO-doped MgLN (PPMgLN) element was used as the nonlinear optical crystal 81, periodically poled MgO-doped MgLT (PPMgLT) element was used as the nonlinear optical crystal 82, and the PPMgLN element 81 is disposed before to convert the fundamental wave 84 having a wavelength of 1064 nm into the SGH 83 having a wavelength of 532 nm. At this time, green light of 3 W could be generated by the PPMgLN element 81 and, then, green light of 10 W could be generated as the SHG 83 through the further wavelength conversion by the PPMgLT element 82. It should be noted that the phase matching wavelengths of the PPMgLN element 81 and the PPMgLT element 82 are conformed to each other. Further, the poled structures at the crystal ends are so adjusted that the phase relationships of the fundamental wave 84 and the SHG 83 conform to each other at a joint part of the PPMgLN element 81 and the PPMgLT element 82.

As described above, the wavelength conversion element of this embodiment includes a Mg-doped $LiNbO_3$ substrate having a periodically poled structure as well as a Mg-doped $LiTaO_3$ substrate, wherein the Mg-doped $LiTaO_3$ substrate and the Mg-doped $LiNbO_3$ substrate are arranged adjacent to each other and have substantially the same phase matching condition.

Figure 22:
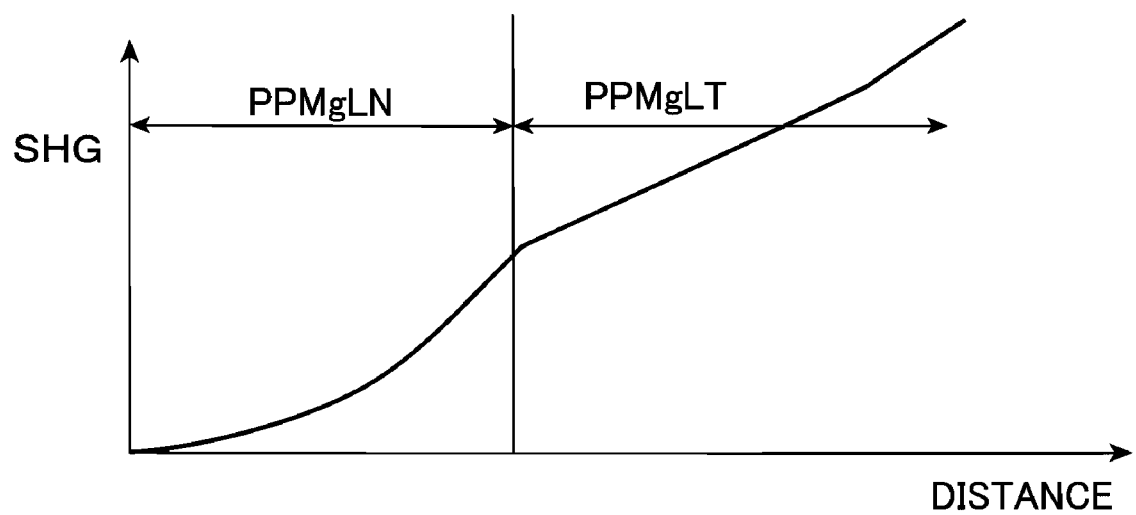
FIG. 22 is a graph showing a relationship between the distance of a PPMgLN element and a PPMgLT element shown in FIG. 21 and an SHG output.

FIG. 22 shows a state of an SHG output increase in relation to the length of the Mg-doped LiTaO$_3$ substrate and the Mg-doped LiNbO$_3$ substrate, i.e. distance. First, since the Mg-doped LiNbO$_3$ substrate has high conversion efficiency, the SHG increase in relation to distance could be increased. Although the Mg-doped LiTaO$_3$ substrate has lower conversion efficiency than the Mg-doped LiNbO$_3$ substrate, stable output could be made up to high output since it has good high output resistance. In this way, higher efficiency and higher output were enabled by two wavelength conversion elements arranged in series, and a high-output light source of 10 W or more could be realized.

Since highly efficient wavelength conversion can be performed with a short element length in this embodiment by combining the Mg-doped LiTaO$_3$ substrate and the Mg-doped LiNbO$_3$ substrate as described above, wavelength tolerance could be increased and a small-size laser light source could be realized. Further, an even smaller short-wavelength light source can be realized if the short-wavelength light source is constructed by adhering or joining the PPMgLN element 81 and the PPMgLT element 82.

Fourth Embodiment

Figure 23:
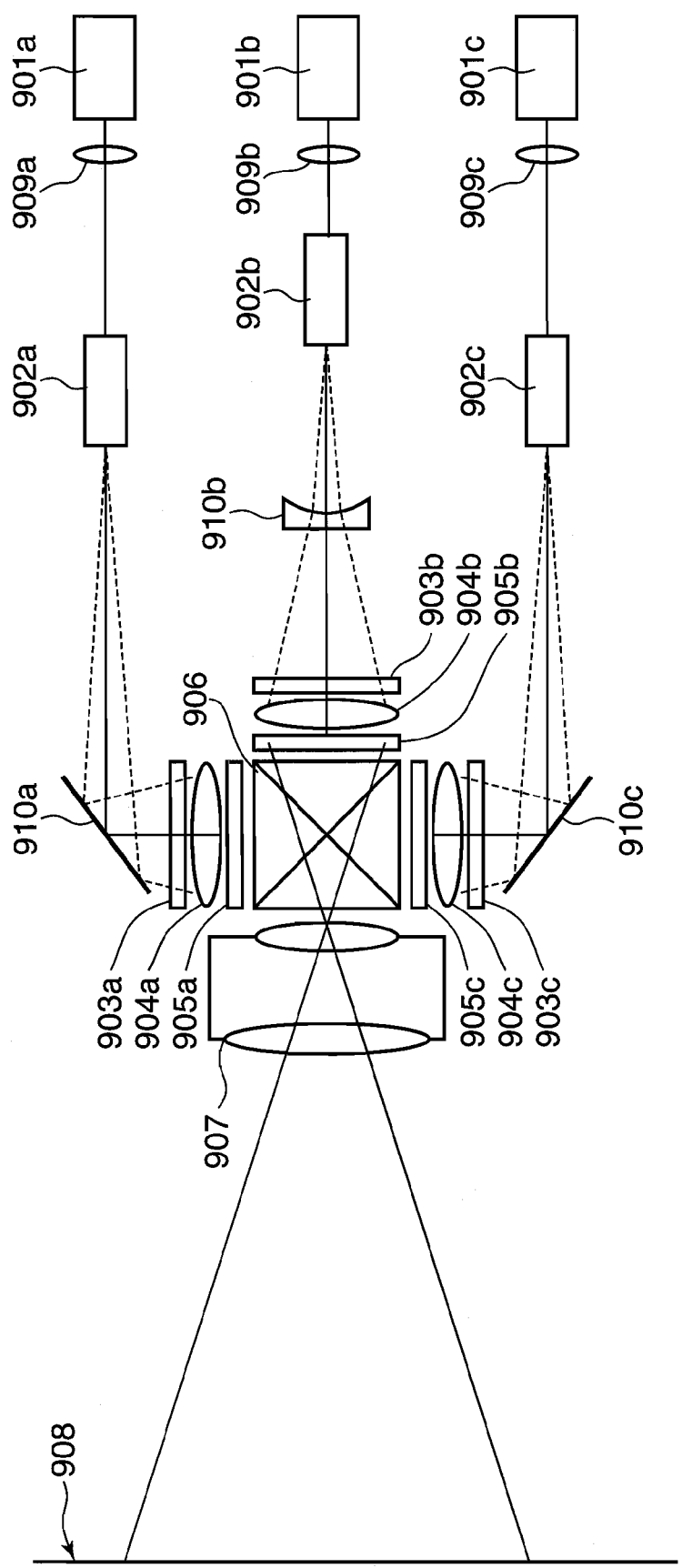
FIG. 23 is a diagram showing an example of a laser display using a wavelength conversion element according to the invention.

Next, an exemplary construction of a laser display (two-dimensional image display) adopting any one of the above wavelength conversion elements is described with reference to FIG. 23. Red (R), green (G) and blue (B) laser light sources 901a to 901c are used as laser light sources, wherein a GaAs semiconductor laser having a wavelength of 638 nm is used as the red light source 901a and a GaN semiconductor laser having a wavelength of 465 nm is used as the blue light source 901c. Further, the wavelength converting green light source including a wavelength conversion element for halving the wavelength of an infrared laser is used as the green light source 901b, and the wavelength conversion element of any one of the aforementioned first to third embodiments can be used as the wavelength conversion element of this wavelength converting green light source.

Although one semiconductor laser is used for each color in this embodiment, there may be adopted such a construction that outputs of two to eight semiconductor lasers are obtained by one fiber output using a bundle fiber. In such a case, wavelength spectrum width becomes very broad such as several nm and the generation of speckle noise can be suppressed by this broad spectrum.

Laser beams of the respective colors emitted from the respective laser light sources 901a, 901b and 901c are two-dimensionally scanned by reflective two-dimensional beam scanning units 902a to 902c, and irradiate diffusion plates 903a to 903c after passing a mirror 910a, a concave lens 910b and a mirror 910c. The laser beams of the respective colors two-dimensionally scanned on the diffusion plates 903a to 903c are introduced to two-dimensional spatial modulation elements 905a to 905c after passing through field lenses 904a to 904c.

Here, an image data is divided into signals of R, G and B, and the respective signals are inputted to the two-dimensional spatial modulation elements 905a to 905c and multiplexed by a dichroic prism 906, whereby a color image is formed. The image multiplexed in this way is projected onto a screen 908 by a projection lens 907. At this time, the diffusion plates 903a to 903c are arranged before the two-dimensional spatial modulation elements 905a to 905c as speckle noise removers, and speckle noise can be reduced by pivoting the diffusion plates 903a to 903c.

It should be noted that lenticular lenses or the like may also be used as the speckle noise removers. Further, reflective spatial modulation elements (DMD mirrors) integrated with micromirrors can be used as the two-dimensional spatial modulation elements 905a to 905c, but two-dimensional spatial modulation elements using liquid crystal or those using galvanometer mirrors or mechanical micro switches (MEMS) may be used as such.

Figure 24:
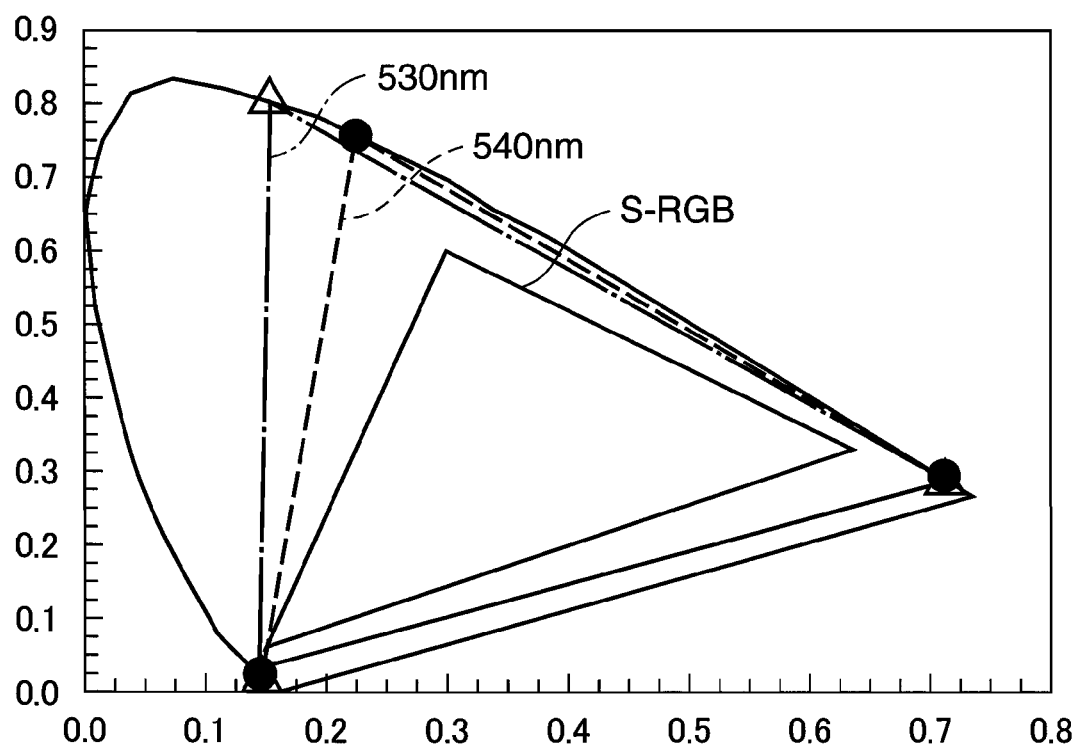
FIG. 24 is a chart showing a color reproduction range of S-RGB standards and those in the case of selecting laser lights having wavelengths of 540 nm and 530 nm as green light.

A color reproduction range of S-RGB standards and color reproduction ranges in the case of selecting laser lights having wavelengths of 540 nm and 530 nm as green light are shown in a chromaticity diagram of FIG. 24. It can be understood that both of the color reproduction ranges in the case of selecting laser lights having wavelengths of 540 nm or 530 nm as green light are wider than that of S-RGB standards reproducible by conventional image displays. Thus, in the two-dimensional image display according to this embodiment, high definition videos can be reproduced by using laser lights as light sources. Further, in view of color reproducibility, the wavelength range of green light used in the two-dimensional image display is preferably from 488 nm to 550 nm and more preferably 500 nm to 540 nm. The wavelength range of green light used in the two-dimensional image display is even more preferably from 526 nm to 529 nm. This is because yellow cannot be reproduced if this wavelength is below 526 nm and the color reproduction range is below 140% at the NTSC ratio if this wavelength is above 529 nm.

The construction of the green light source 901b is not particularly limited to the above example, and a second harmonic generator (wavelength conversion fiber laser light source) for generating second harmonic of a fiber laser light source using the wavelength conversion element according to any one of the above first to third embodiments as a wavelength conversion crystal may be used. The construction of this second harmonic generator is described with reference to FIG. 25.

Figure 25:
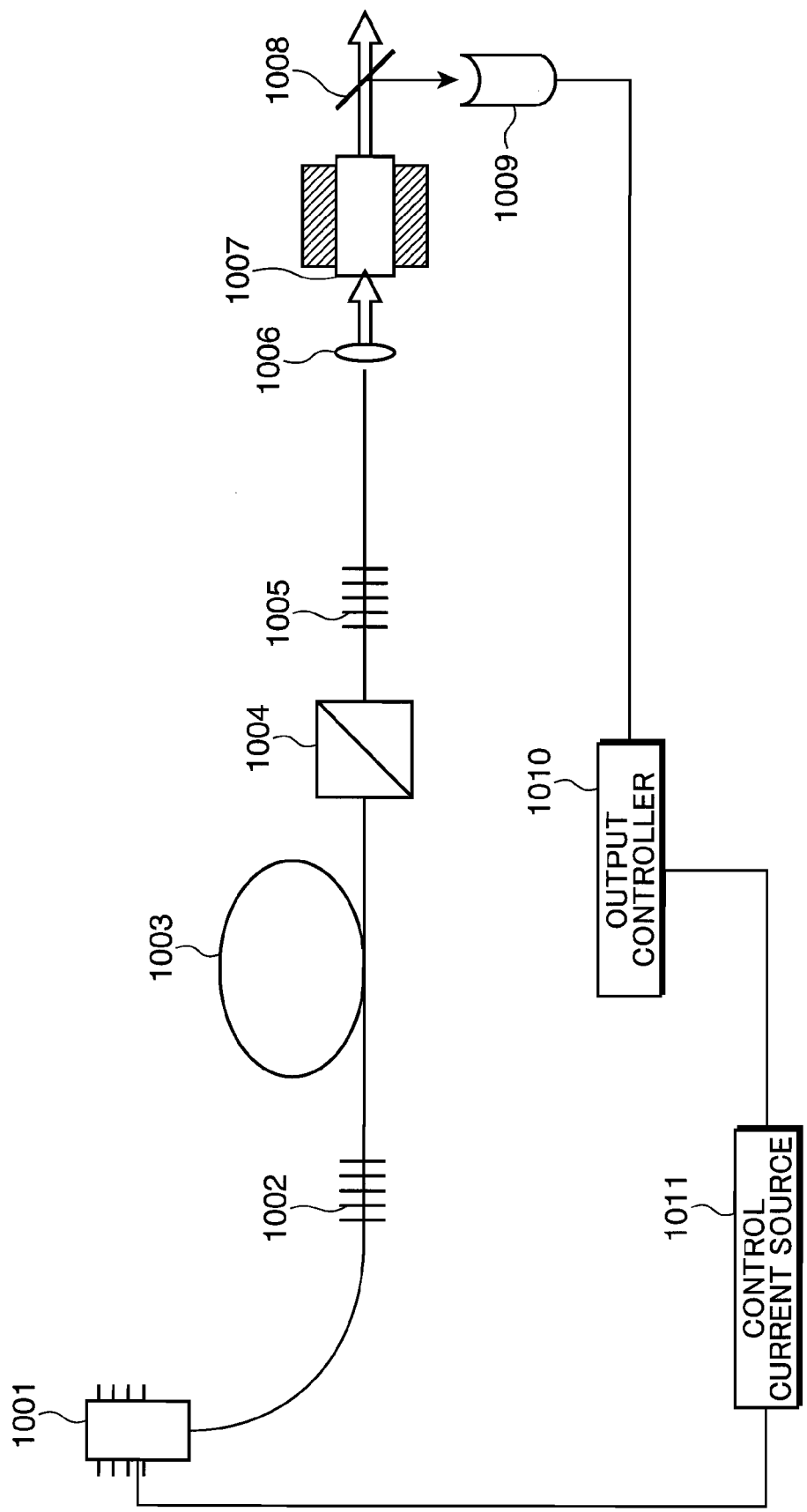
FIG. 25 is a diagram showing an example of a second harmonic generator using a wavelength conversion element according to the invention.

The second harmonic generator shown in FIG. 25 includes an excitation (pump) laser 1001, a Yb-doped cladding pump fiber 1003, a polarizer 1004, a fiber grating 1005, a lens 1006, a wavelength conversion element (SHG crystal) 1007, a splitter 1008, a photodiode (PD) 1009, an output controller 1010 and a control current source ($I_L$ current source) 1011.

A laser diode is used as the excitation laser 1001, and the Yb-doped cladding pump fiber 1003 is used as a laser medium. The Yb-doped cladding pump fiber 1003 is excited by the excitation laser 1001 (wavelength of about 195 nm and maximum output of 30 W), and the wavelength thereof is controlled to the vicinity of 1060 nm. The polarizer 1004 converts oscillated fundamental wave into linearly polarized light. The light converted into the linearly polarized light is incident on the wavelength conversion element 1007 via the fiber grating 1005 and the lens 1006.

The thus oscillated light (wavelength of about 1060 nm) is incident on the wavelength conversion element 1007 including a nonlinear optical crystal (e.g. periodically poled MgO:LiNbO$_3$ crystal, length of 10 mm) to be converted into green light having a half wavelength, i.e. 530 nm. At this time, since the phase matching wavelength of the wavelength conversion element 1007 changes depending on the temperature of the crystal, the wavelength conversion element 1007 is temperature-controlled with an accuracy of 0.01° C. and generates second harmonic of the oscillated light.

A part of the generated green light is inputted to the PD 1009 after being split by the splitter 1008. The PD 1009 measures the intensity of the green light by monitoring the output of the wavelength conversion crystal 1006. The output controller 1010 executes such a control as to keep the output constant based on the second harmonic output detected by the PD 1009, and the control current source 1011 controls the output of the excitation laser 1001 upon receiving a control signal from the output controller 1010. By the output controller 1010 converting the intensity of the light measured by the PD 1009, an output current of the excitation light source can be controlled.

It has been a general practice to heat the temperature of the wavelength conversion element to 100° C. or higher in the case of obtaining W-class outputs. For example, in the case of using a $LiNbO_3$ crystal doped with 5.6 mol of Mg, a stable green light output can be obtained even if the wavelength conversion element is kept at room temperature as described in the first embodiment. Thus, the wavelength conversion element can be used even within a range of 20° C. to 60° C., whereby the power consumption of the device can be reduced. In addition, in the case of keeping the crystal at temperature higher than room temperature (40° C. to 60° C.), a heater can be used without using an expensive Peltier element, wherefore material cost can be reduced.

Besides the two-dimensional image display having such a construction, the present invention is also applicable to a mode in which light is projected from behind a screen (rear projection display) or usable as a backlight of a general liquid crystal display element. In these modes as well, the color reproducibility of the two-dimensional image display can be improved similar to the above. Particularly, in the case of being used as a rear projection display or as a backlight of liquid crystal display element, a light source output needs to be increased in order to make a viewing angle larger. In this case, light sources of 2.5 W or more, preferably of 3 W or more are necessary respectively for R, G and B.

In such a two-dimensional image display, lights of 2 W or more are necessary for R, G and B in order to obtain brightness of 500 lm or higher that can be said to be practical. On the other hand, it has been a general practice to generate second harmonic using a LBO (lithium triborate: $LiB_2O_5$) crystal in order to obtain green light of such W class. However, since this LBO crystal has a deliquescent property, the crystal needs to be kept at 150° C. In addition, since the nonlinear optical constant determining conversion efficiency is as low as about 1/20 of that of $MgO:LiNbO_2$, there have been problems that the construction of the wavelength conversion element becomes more complicated by having an external resonator and the power consumption of the device increases.

However, since the wavelength converting green light source using $MgO:LiNbO_3$ capable of obtaining a W-class green high output is used in this embodiment, the two-dimensional image display can be constructed without requiring the heating of the crystal and an optical system having a complicated construction.

Further, if the minimum and necessary brightness as the two-dimensional image display is assumed to be 300 cd/m$^2$, the intensity of green light needs to be 1.5 W or more. In order to realize this intensity, a ratio of the SHG to the fundamental wave is preferably 25% to 60%. The conversion efficiency decreases to increase power consumption if this ratio is below 25%, whereas the breakdown of crystal occurs and output variation becomes excessive if this ratio exceeds 60%.

Although the laser display is described in this embodiment, the optical device to which the present invention is applied is not particularly limited to this example and the present invention is also effectively applied to optical disc devices and measurement devices. The application of the laser light source of the present invention to an optical disc device enables a stable high output having high coherency to be obtained and is effective in holographic recording. Besides, the present invention is also applicable to backlights of liquid crystal devices. If the laser light source of the present invention is used as a backlight for crystal, high-efficiency and high-luminance crystal can be realized by high conversion efficiency. Further, a display having good color reproducibility can be realized since a wide color range can be expressed by laser light.

The laser light source of the present invention can also be utilized as an illumination light source. If a fiber laser is used as a fundamental wave light source, highly efficient electro-optical conversion is possible since conversion efficiency is high. Further, by using a fiber, light can be transmitted to a distant place with low loss. As a result, indoor illumination by central light generation becomes possible by generating light at a specific place and transmitting the generated light to distant places. Further, the fiber laser is effective in light delivery since it can be coupled to a fiber with low loss.

Fifth Embodiment

Figure 26:
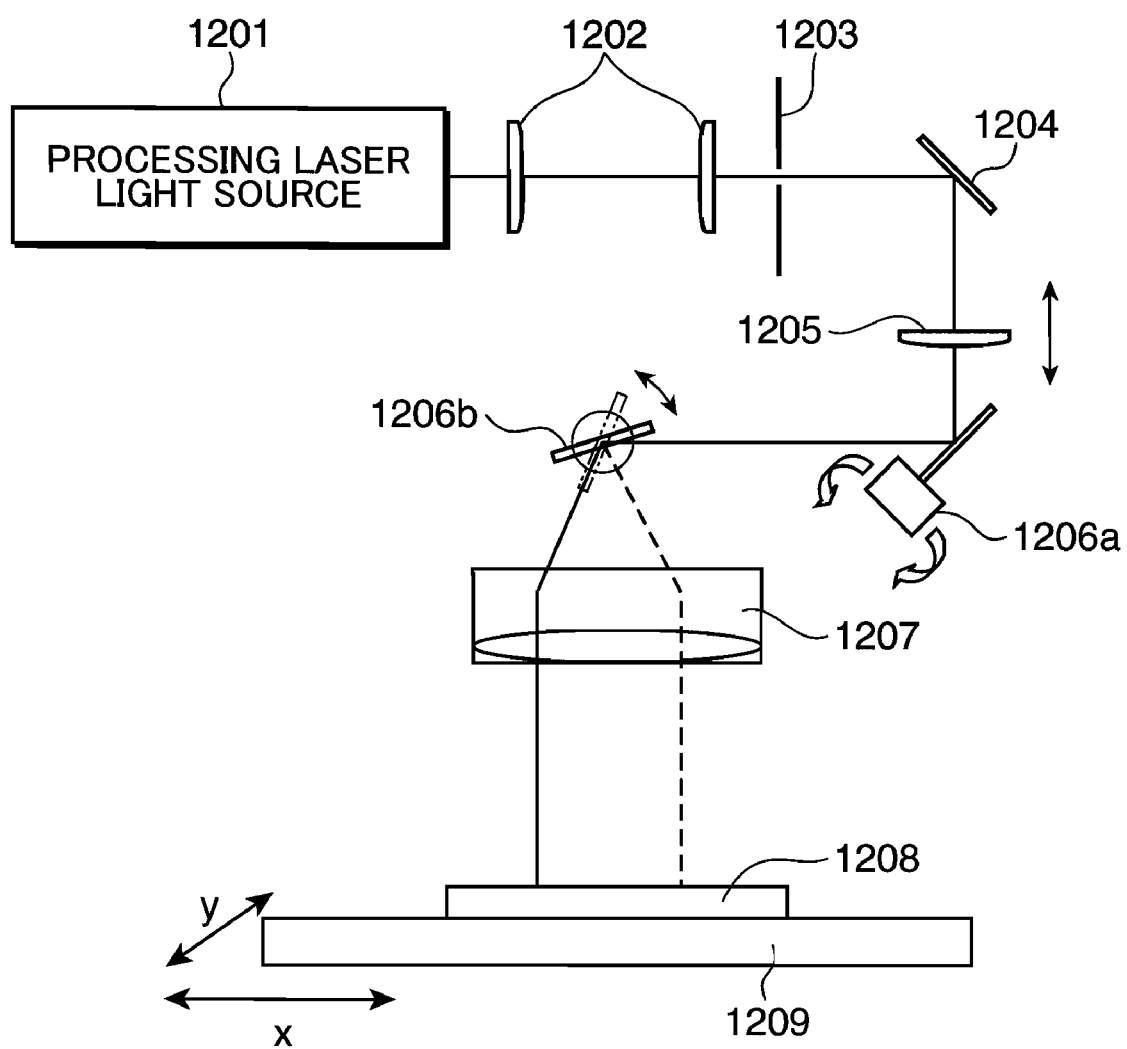
FIG. 26 is a diagram showing an example of a laser processing/imaging system using a wavelength conversion element according to the invention.

Next, an example of a laser processing system adopting any one of the above wavelength conversion elements is described with reference to FIG. 26. This embodiment relates to a laser imaging/processing system using a laser light source (green light: wavelength of 532 nm), in which the wavelength conversion element according to any one of the above first to third embodiments is used, as a processing laser light source 1201 and suitable for copper processing in printed circuit boards or the like. It should be noted that the construction of the green light source 1201 is not described in detail since being similar to that of the fourth embodiment.

Green light emitted from the processing laser light source 1201 is collimated by a coupling lens 1202. Thereafter, the green light has the beam diameter thereof adjusted by passing through a slit 1203, and is introduced to galvanometer mirrors 1206a, 1206b via a lens 1205 after having the optical axis thereof bent by a mirror 1204. The galvanometer mirrors 1206a, 1206b move the optical axis of the laser beam in a processing direction (x-direction or y-direction) and, thereafter, the beam is caused to be incident on a target object 1208 mounted on an x-y stage 1209 via an f-θ lens 1207, thereby performing a desired processing. The wavelength range of the laser light used for the processing is preferably from 400 nm, which is usable for the mastering of optical discs, to 600 nm, which is usable for resin welding.

Conventionally, a laser light source using a LBO crystal has been used as a laser light source used in such a laser processing system. However, this crystal has a deliquescent property, and needs to be heated to 150° C. even when it is not used or to be used in dry atmosphere. In addition, there has been a problem that surface coating is broken due to a difference in the thermal expansion coefficient of the crystal. There were reports that $LiNbO_3$ doped with 5 mol of MgO had no deliquescent property, but outputs of 200 to 300 mW were obtained in most examples. In the case where an attempt is made to obtain a green light output of 2 W or more as described above, there has a problem of, e.g. breaking the crystal.

However, since $MgO:LiNbO_3$ or the like capable of obtaining W-class green high outputs are used in this embodiment, outputs of 3 W or more can be stably obtained. Further, since this crystal has no deliquescent property, the deterioration of the crystal can be eliminated even with the power supply shut off if the system is not used. As a result, the power consumption of the system for driving a heater can be reduced, and the system can be miniaturized.

In this embodiment, it is also possible to generate argon ion lasers (488 nm, 514 nm) by changing the wavelength of the fundamental wave. In this case, as compared to a large-size conventional light source using a glass tube, the volume of the laser light source used can be decreased to 20 to 30%, the miniaturization and lower power consumption of light shaping devices and various analytical instruments such as particle analyzers and blood analyzers can be realized.

Further, in the above laser processing system, peak power per pulse generally increases if the processing laser light source 1201 is used as a pulse light source. Thus, ultraviolet light induced green light absorption occurs when an average output of continuous light is 2 W or more, and occurs when an average output of pulsed oscillation is 1 W or more. Further, in pulsed oscillation, light having abnormally high peak power is generated, laser damage occurs in the crystal and mirrors to stop the generation of green light unless the waveform of a current to be supplied to an excitation laser installed in a laser light source is considered.

Figure 27A:
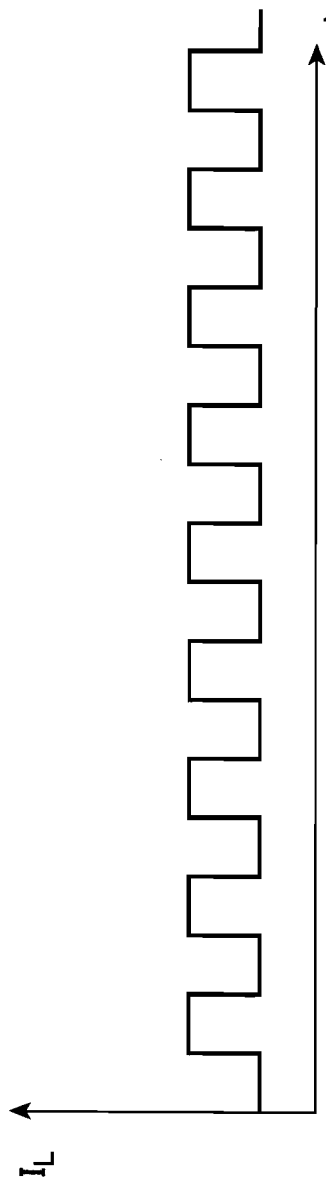
FIGS. 27A to 27C are charts showing the current waveform of an excitation laser, the output waveform of fundamental wave and the output waveform of green light in the case of inputting rectangular wave to a conventional laser light source.
Figure 27B:
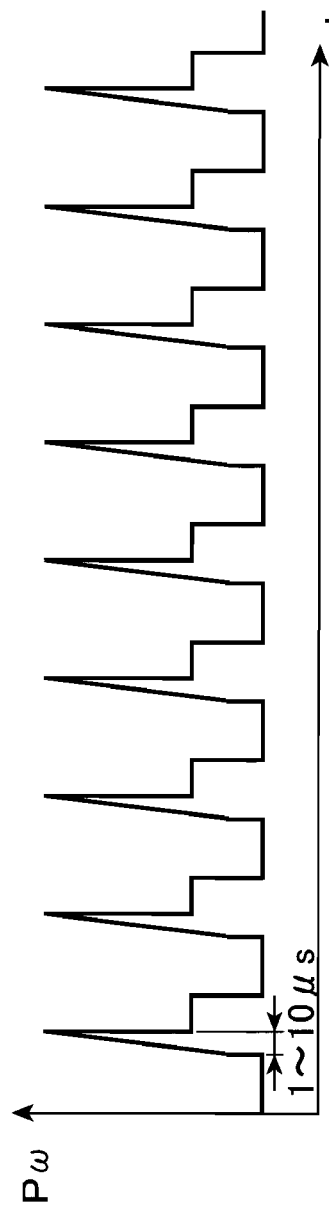
Figure 27C:
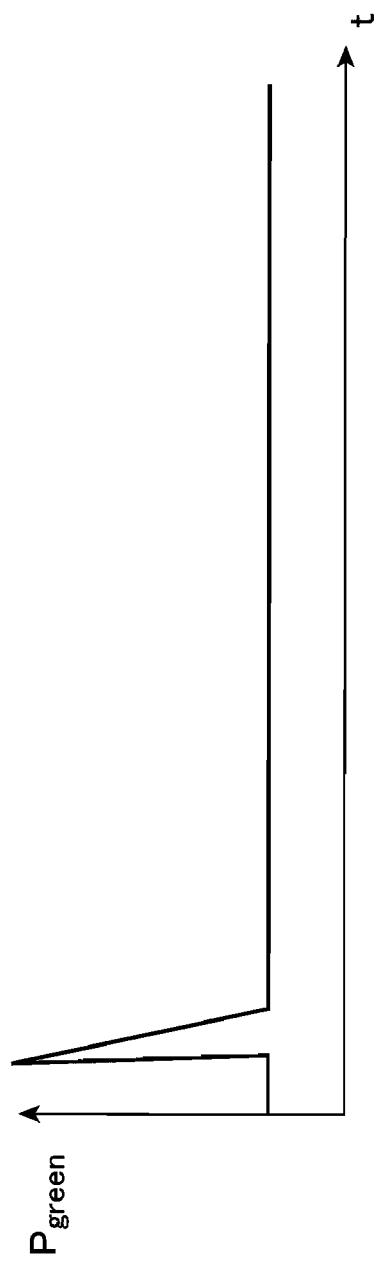

FIGS. 27A to 27C show waveform $I_L$ of current to an excitation laser, output waveform $P_\omega$ of fundamental wave to be inputted to a wavelength conversion element and output waveform $P_{green}$ of green light from the wavelength conversion element when rectangular wave is inputted to a conventional laser light source.

Since inversion distribution formed in the wavelength conversion element as laser medium is outputted as light simultaneously with the rise of a pulse as shown in FIG. 27A even if the current waveform $I_L$ is rectangular, there has been a problem that the fundamental wave $P_\omega$ having unexpected peak power is outputted at a pulse width of 1 to 10 μm as shown in FIG. 27B, and the wavelength conversion element and the like are broken by the high peak input and the green light having high peak is instantaneously outputted as the output waveform $P_{green}$ of the green light, but no output of the green light can be obtained thereafter.

Figures 28A, 28B, 28C:
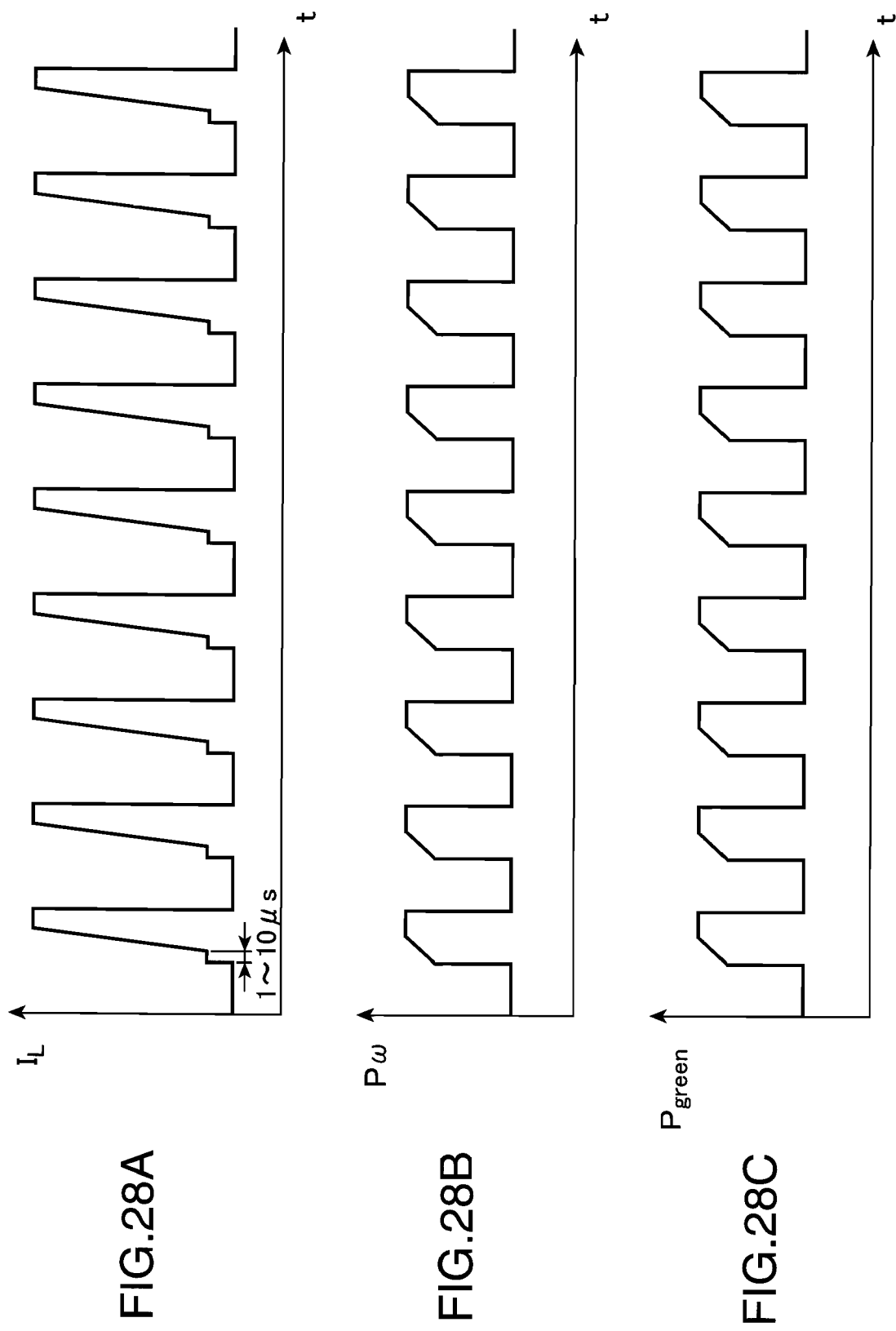
FIGS. 28A to 28C are charts showing the current waveform of the excitation laser, the output waveform of fundamental wave and the output waveform of green light in the case of inputting rectangular wave to the laser processing/imaging system shown in FIG. 26.

Thus, in this embodiment, a current value, which is 5 to 30%, more preferably 10 to 20% of a specified peak value, is given during the first period of 1 to 10 μs as the current waveform $I_L$ to the excitation laser 1001 and, thereafter, the current waveform $I_L$ is set to a desired current value (specified peak value), for example, as shown in FIG. 28A. As a result, as shown in FIG. 28B, the output waveform $P_\omega$ of the fundamental wave to be inputted to the wavelength conversion element 1007 moderately increases up to a specified peak value without forming any high peak when the pulse rises, thereby being able to prevent the generation of a high peak output.

By restricting the current value when the current waveform to be supplied to the excitation laser 1001 of the fundamental wave generating light source rises to 5 to 30%, more preferably 10 to 20% of the stationary current value, a stable green light output like the output waveform $P_{green}$ of the green light can be obtained as shown in FIG. 28C. The period during which the current value is restricted to 5 to 30%, more preferably 10 to 20% of the stationary current value preferably lies within a range of 1 to 10 μs.

Figure 29A:
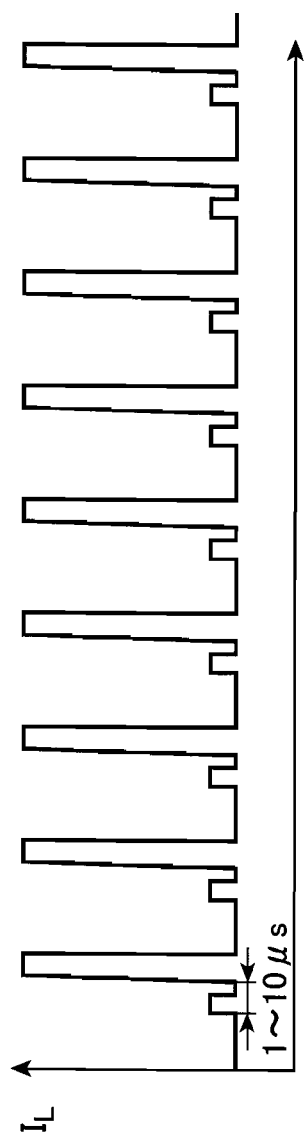
FIGS. 29A to 29C is charts showing another examples of the current waveforms inputted to the excitation laser of the laser processing/imaging system shown in FIG. 26.
Figure 29B:
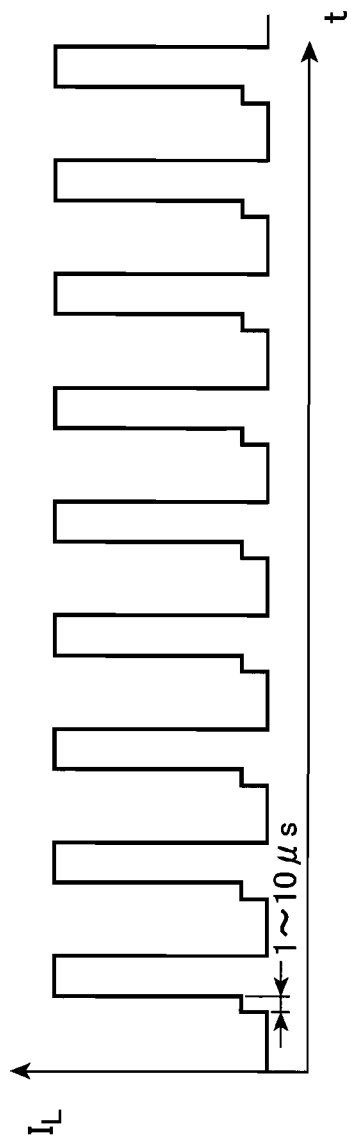
Figure 29C:
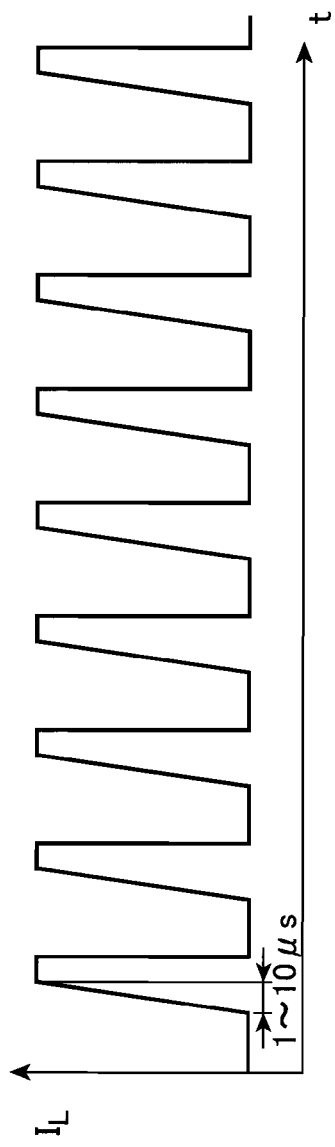

The current waveform $I_L$ is not particularly limited to the example shown in FIG. 28A, and effects similar to the above can be obtained, i.e. it can be realized to prevent the damage of optical components caused by the fundamental wave having high peak power and to stabilize the green light output, the reliability of the system can be improved and the life thereof can be extended even by a method for causing the excitation laser 1001 to preliminarily emit light at a low current within the 5 to 30%, more preferably 10 to 20% range of the crest value and, thereafter, setting a desired current value as shown in FIGS. 29A and 29B (a method for combining smaller pulses and larger pulses as the current waveform $I_L$ or a method for increasing the current waveform $I_L$ stepwise) or by a method for gradually increasing the current value as shown in FIG. 29C (method for increasing the current waveform $I_L$ like a lamp function).

It was also confirmed that the generation of a high peak output at the rise of the pulse cannot be avoided only by superimposing a modulation signal while applying a direct-current bias to the current waveform at a current value below an oscillation threshold value of a solid-state laser or fiber laser. In the case of avoiding the generation of a high peak output at the rise of the pulse by superimposing a high-frequency signal of 20 MHz or below with the current waveform of the excitation laser, screen flicker occurs. Therefore, when the above second harmonic generator is used in a two-dimensional image display, modulation depth preferably lies within a range of 0 to 50%.

Since an output can be modulated by the current waveform of the excitation laser in the laser light source using the above driving method, a modulation element using an electro-optical effect or an acoustooptical effect becomes unnecessary, thereby enabling the miniaturization and lower cost of the light source. In addition, the laser light source is very useful upon constructing a two-dimensional image display or a laser processing system realized by a two-dimensional spatial modulation element using a galvanometer mirror, mechanical micro switches (MEMS) or the like and having a brightness of 100 lm or higher.

It should be noted that the wavelength conversion elements, the laser light source, the two-dimensional image display and the laser processing system exemplified in the above respective embodiments are merely examples and it goes without saying that other modes are possible.

INDUSTRIAL APPLICABILITY

The wavelength conversion element according to the present invention prevents the breakdown of crystal and realizes the stabilization of output characteristics by improving visible light transmission characteristics when ultraviolet light is irradiated. By these effects, the absorption of second harmonic (green light) caused by third harmonic, which is ultraviolet light, can also be suppressed and the saturation of output and the breakdown of crystal can be avoided. In addition, it has been a conventional practice to generate high output by distributing a fundamental wave output and using a plurality of wavelength conversion elements but, by using the wavelength conversion element according to the present invention, it becomes possible to simplify devices, improve the reliability thereof, avoid complicated adjustments and reduce production cost. Therefore, high-luminance laser displays and the like can be realized by simpler constructions.

What is claimed is:

1. A wavelength conversion element for performing a wavelength conversion, the wavelength conversion element comprising a substrate including a nonlinear optical single crystal having a periodically poled structure, wherein:
   the substrate comprises lithium niobate;
   the lithium niobate is Mg-doped has a congruent composition, such that the Mg-doped lithium niobate has a Mg concentration of 5.1 mol % to 5.7 mol %;
   a depth of the periodically poled structure is 20% or more of a thickness of the substrate;
   a visible light transmittance of the substrate is 85% or higher when ultraviolet light is irradiated to the substrate; and the wavelength conversion element performs the wavelength conversion by outputting laser light having an average output of 1 W or more by shortening a wavelength of input laser light emitted from a light source, the wavelength of the input laser light emitted from the light source being 640 nm to 2000 nm.

2. The wavelength conversion element according to claim 1, wherein a wavelength of the ultraviolet light is 320 nm to 380 nm.

3. The wavelength conversion element according to claim 1, wherein a wavelength of the visible light is 400 nm to 660 nm.

4. The wavelength conversion element according to claim 1, wherein at a time of the wavelength conversion a temperature of the substrate is 20° C. to 60° C.

5. A laser light source, comprising the wavelength conversion element according to claim 1, wherein the wavelength conversion element outputs continuous light having an average output of 2 W or more and a wavelength of 400 nm to 660 nm.

6. A two-dimensional image display, comprising the laser light source according to claim 5, wherein an image is displayed using laser light emitted from the laser light source.

7. A laser processing system, comprising the laser light source according to claim 5, wherein an object is processed using laser light emitted from the laser light source.

8. A laser light source, comprising the wavelength conversion element according to claim 1, wherein the wavelength conversion element outputs pulsed light having an average output of 1 W or more and a wavelength of 400 nm to 660 nm.

9. A two-dimensional image display, comprising the laser light source according to claim 8, wherein an image is displayed using laser light emitted from the laser light source.

10. A laser processing system, comprising the laser light source according to claim 8, wherein an object is processed using laser light emitted from the laser light source.

11. The wavelength conversion element according to claim 1, wherein the depth of the periodically poled structure is 200 μm or larger when the thickness of the substrate is 1 mm.

12. The wavelength conversion element according to claim 1, wherein an average depth of the poling portion is within a 40% to 95% range of the thickness of the substrate.

13. A wavelength conversion element for performing a wavelength conversion, the wavelength conversion element comprising a substrate including a nonlinear optical single crystal having a periodically poled structure, wherein:
the substrate comprises lithium tantalate;
the lithium tantalite is Mg-doped and has a congruent composition, such that the Mg-doped lithium tantalite has a Mg concentration of 5.0 mol % to 8.0 mol %;
a depth of the periodically poled structure is 20% or more of a thickness of the substrate;
a visible light transmittance of the substrate is 85% or higher when ultraviolet light is irradiated to the substrate; and
the wavelength conversion element performs the wavelength conversion by outputting laser light having an average output of 1 W or more by shortening a wavelength of input laser light emitted from a light source, the wavelength of the input laser light emitted from the source being 640 nm to 2000 nm.

14. The wavelength conversion element according to claim 13, wherein a wavelength of the ultraviolet light is 320 nm to 380 nm.

15. The wavelength conversion element according to claim 13, wherein a wavelength of the visible light is 400 nm to 660 nm.

16. The wavelength conversion element according to claim 13, wherein at a time of the wavelength conversion a temperature of the substrate is 20° C. to 60° C.

17. A laser light source, comprising the wavelength conversion element according to claim 13, wherein the wavelength conversion element outputs continuous light having an average output of 2 W or more and a wavelength of 400 nm to 660 nm.

18. A two-dimensional image display, comprising the laser light source according to claim 17, wherein an image is displayed using laser light emitted from the laser light source.

19. A laser processing system, comprising the laser light source according to claim 17, wherein an object is processed using laser light emitted from the laser light source.

20. A laser light source, comprising the wavelength conversion element according to claim 13, wherein the wavelength conversion element outputs pulsed light having an average output of 1 W or more and a wavelength of 400 nm to 660 nm.

21. A two-dimensional image display, comprising the laser light source according to claim 20, wherein an image is displayed using laser light emitted from the laser light source.

22. A laser processing system, comprising the laser light source according to claim 20, wherein an object is processed using laser light emitted from the laser light source.

23. The wavelength conversion element according to claim 13, wherein the depth of the periodically poled structure is 200 μm or larger when the thickness of the substrate is 1 mm.

24. The wavelength conversion element according to claim 13, wherein an average depth of the poling portion is within a 40% to 95% range of the thickness of the substrate.

* * * * *